United States Patent
Mazur et al.

(10) Patent No.: US 7,390,689 B2
(45) Date of Patent: Jun. 24, 2008

(54) SYSTEMS AND METHODS FOR LIGHT ABSORPTION AND FIELD EMISSION USING MICROSTRUCTURED SILICON

(75) Inventors: Eric Mazur, Concord, MA (US); James Edward Carey, III, Woburn, MA (US); Catherine H. Crouch, Swarthmore, PA (US); Rebecca Jane Younkin, Arlington, MA (US); Claudia Wu, Boston, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 10/155,429

(22) Filed: May 24, 2002

(65) Prior Publication Data
US 2003/0029495 A1    Feb. 13, 2003

Related U.S. Application Data

(60) Provisional application No. 60/293,590, filed on May 25, 2001.

(51) Int. Cl.
  *H01L 21/00* (2006.01)
  *H01L 31/00* (2006.01)
(52) U.S. Cl. .................. 438/71; 136/256; 136/261
(58) Field of Classification Search .............. 136/256, 136/251, 246, 259, 261; 257/436, 466; 438/69, 438/71, 64
See application file for complete search history.

(56) References Cited

U.S. PATENT DOCUMENTS

| 4,201,450 A | | 5/1980 | Trapani |
| 4,277,793 A | * | 7/1981 | Webb .................. 257/436 |
| 4,965,784 A | | 10/1990 | Land et al. |
| 5,773,820 A | * | 6/1998 | Osajda et al. ......... 250/231.14 |

OTHER PUBLICATIONS

Hu et al, Solar Cells from Basic to Advanced Systems, McGraw-Hill Book Company, NY, 1983, p. 39.*
"Basic Photovoltaic Principles and Methods," Solar Energy Research Institute, Van Nostrand Reinhold Company, NY, 1984, pp. 45-47 and 138-142.*
Her et al, "Microstructuring of silicon with femtosecond laser pulses," Applied Physics Letters, vol. 73, No. 12, Sep. 21, 1998.*
Wu et al, "Black silicon a new light absorber," APS Centennial Meeting, Mar. 23, 1999.*

(Continued)

*Primary Examiner*—Nam X. Nguyen
*Assistant Examiner*—Jeffrey T Barton
(74) *Attorney, Agent, or Firm*—Thomas J. Engellenner; Reza Mollaaghababa; Nutter McClennen & Fish, LLP

(57) ABSTRACT

Methods and systems for absorbing infrared light, and for emitting current are described. A sample, such as a sample containing mainly silicon, is microstructured by at least one laser pulse to produce cone-like structures on the exposed surface. Such microstructuring enhances the infrared absorbing, and current emission properties of the sample.

21 Claims, 18 Drawing Sheets

OTHER PUBLICATIONS

Wu et al, "Femtosecond laser-gas-solid interactions," Thesis presented to the Deparatment of Physics at Harvard University, pp. 1-113, 126-136, Aug. 2000.*

Wu et al, "Near-unity below-band-gap absorption by microstructured silicon," Applied Physics Letters, vol. 78, No. 13, Mar. 20, 2001.*

Younkin et al, "Infrared absorption by conical silicon microstructures made in a a variety of background gases using femtosecond-laser pulses," Proc. CLEO 2001 (Baltimore, MD, 2001), pp. 556, May 11, 2001.*

Carey, J.E. et al. "Field Emission from Silicon Microstructures Formed by Femtosecond Laser Assisted Etching," *Proc. CLEO* 2001 (Baltimore, MD, 2001) 555-557.

Carey, J.E. et al. "Fabrication of Micrometer-Sized Conical Field Emitters Using Femto-second Laser-Assisted Etching of Silicon," *Proc. IVMC* 2001 (Davis, CA, 2001) 75-76.

Her, T.-H. et al. "Microstructuring of silicon with femtosecond laser pulses," *Appl. Phys. Lett.* 73, 1673-1675 (1998).

Her, T.-H. et al. "Femtosecond laser-induced formation of spikes on silicon," *Applied Physics A* 70, 383-385 (2000).

Wu, C. et al. "Black silicon a new light absorber," *APS Centennial meeting* (Mar. 23, 1999).

Wu, C. "Femtosecond laser-gas-solid interactions," Thesis presented to the Department of Physics at Harvard University pp. 1-113, 126-136(Aug. 2000).

Wu, C. et al. "Near-unity below-band gap absorption by microstructured silicon," *Appl. Phys. Lett.* 78, 1850-1852 (2001).

Younkin, R. et al. "Infrared absorption by conical silicon microstructures made in a variety of background gases using femtosecond-laser pulses," *Proc. CLEO* 2001 (Baltimore, MD, 2001) p. 556.

Younkin, R.A. "Surface studies and microstructure fabrication using femtosecond laser pulses," Thesis presented to the Division of Engineering & Applied sciences at Harvard University (Aug. 2001).

Dolgaev et al., "Formation Of Conical Microstructures Upon Laser Evaporation Of Solids", *Appl. Phys. A*, 73, 177-181 (2001).

Her et al., "Novel Conical Microstructures Created In Silicon With Femtosecond Laser Pulses", CLEO 1998 (San Francisco, CA 1998) 511-512.

Pedraza et al., "Silicon Microcolumn Arrays Grown By Nanosecond Pulsed-Excimer Laser Irradiation", *Appl. Phys. Lett.*, 74 (16), 2322-2324 (1999).

Sanchez et al., "Dynamics Of The Hydrodynamical Growth Of Columns On Silicon Exposed To ArF Excimer-Laser Irradiation", *Appl. Phys. A*, 66, 83-86 (1998).

Sanchez et al., "Whiskerlike Structure Growth On Silicon Exposed To ArF Excimer Laser Irradiation", *Appl. Phys. Lett.*, 69 (5), 620-622 (1996).

* cited by examiner

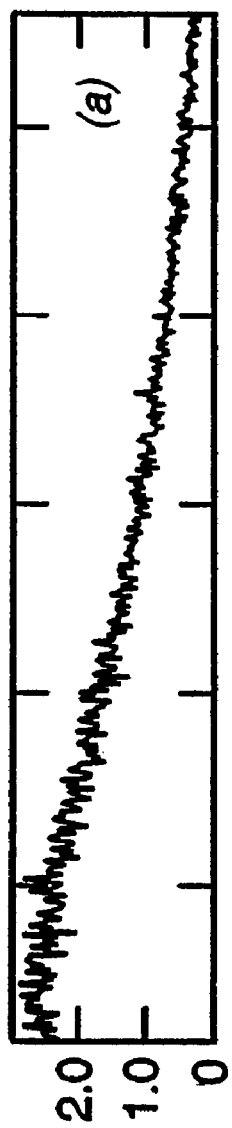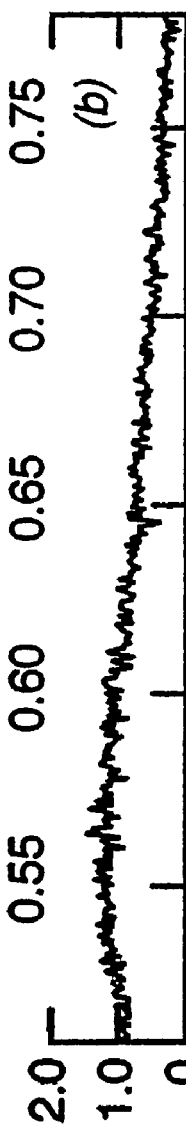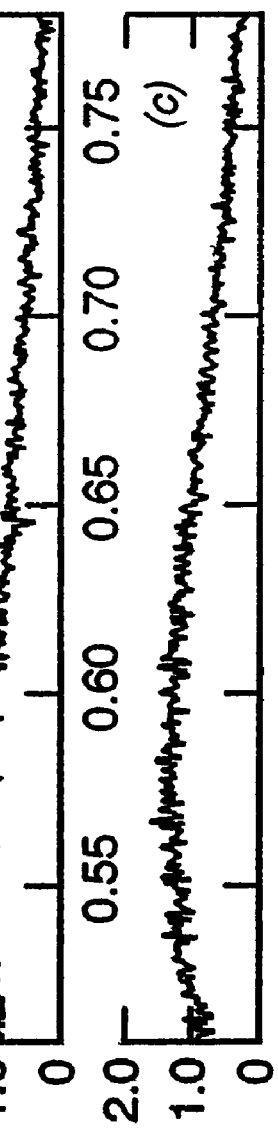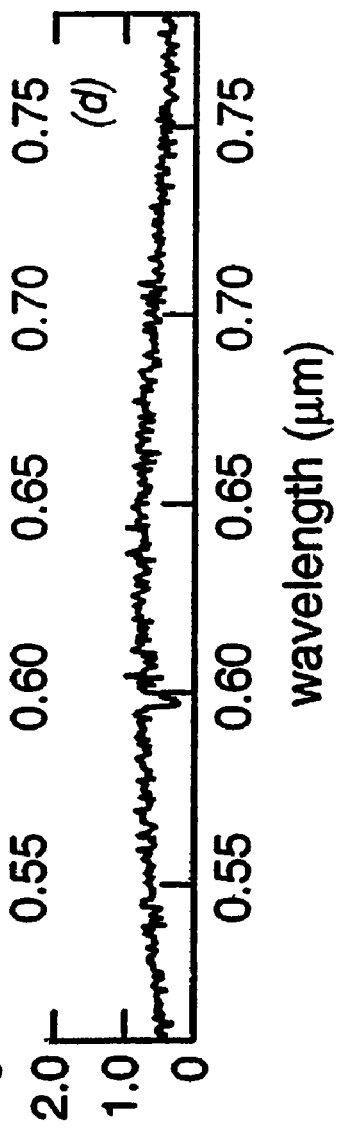
FIG. 12A
FIG. 12B
FIG. 12C
FIG. 12D

SYSTEMS AND METHODS FOR LIGHT ABSORPTION AND FIELD EMISSION USING MICROSTRUCTURED SILICON

RELATED APPLICATION

The following application claims priority to Provisional Application Ser. No. 60/293,590 filed on May 25, 2001 by Mazur et al.

STATEMENT REGARDING FEDERALLY SPONSORED RESEARCH OR DEVELOPMENT

This invention was sponsored by Department of Defense contract number DAAD19-99-1-0009, and National Science Foundation grant number DMR-9809363 and the government has certain rights to the invention.

TECHNICAL FIELD

The present invention relates generally to semiconductor devices, and specifically relates to systems and methods for absorbing light, emitting current, and luminescence using microstructured silicon.

BACKGROUND OF THE INVENTION

Silicon devices and methods for fabricating them are ubiquitous in modern society. This ubiquity arises because crystalline silicon is cheap, abundant, and present in a myriad of optoelectronic devices that include microprocessor chips. Because of the wide use, many efficient methods have been developed for engineering silicon into various shapes and sizes. Therefore, if both silicon and a second substance can alternatively be used to fulfil some function, it is often more advantageous to use silicon because of familiarity of use, and manufacture.

While crystalline silicon has many useful properties that make the element eminently suitable for semiconductor applications, there are desirable properties that crystalline silicon does not possess. For example, crystalline silicon has a band gap of 1.07 eV, and hence only absorbs light that is no less energetic than visible light, which limits its use in certain optoelectronic devices. In addition, the current emitting and luminescent properties of crystalline silicon also limit the use of this element in certain optoelectronic devices. Any technique that would improve the 5 light absorption, current emission, or luminescent properties of silicon would be very welcome.

SUMMARY OF THE INVENTION

Presented herein is a system and method for enhancing the light absorption, the current emitting, and the luminescent properties of silicon. These properties are enhanced by microstructuring silicon using femtosecond laser pulses. The resultant microstructured silicon contains cone-like structures on its surface that help to enhance these properties.

In particular, a method for absorbing electromagnetic radiation to harness energy is described herein. The method includes providing a semiconductor having a plurality of cone-like structures formed thereon by laser light, the semiconductor possessing a band gap energy, $E_{bg}$. The term "light" is used herein to denote not just visible light, but all electromagnetic radiation, such as infrared light, for example. In addition to using laser light to produce the cone-like structures, the semiconductor can also be exposed to a background gas to help form the structures. The background gas can include a halogenic gas, i.e., a gas containing a halogen, such as $SF_6$. The method for absorbing electromagnetic radiation further includes exposing the semiconductor, which can include primarily silicon, to electromagnetic radiation to allow the sample to absorb a portion thereof, the electromagnetic radiation having a frequency smaller than $E_{bg}$ divided by Planck's constant. The method also includes harnessing energy from the absorbed radiation.

Thus, the method can include exposing the microstructured sample composed primarily of silicon to electromagnetic radiation to allow the sample to absorb a portion thereof, the electromagnetic radiation having a wavelength greater than about 1.05 micrometers (corresponding approximately to the 1.07 eV band gap of silicon). If the electromagnetic radiation includes sunlight, the step of harnessing can include utilizing the sample in a solar cell to convert solar energy into other types of energy, such thermal energy, electrical energy, and chemical energy. Instead, the step of harnessing can include utilizing the sample in a photodetector to convert energy of the electromagnetic radiation into an electrical signal indicative of the intensity of the electromagnetic radiation.

Also described herein is a method for emitting an electric current. The method includes providing a sample composed of primarily silicon, the sample having a plurality of cone-like structures formed thereon by laser light. In addition to using laser light to produce the cone-like structures, the semiconductor can also be exposed to a background gas to help form the structures. The background gas can include a halogenic gas, i.e., a gas containing a halogen, such as $SF_6$. The method for emitting an electric current also includes applying an electric field to the sample thereby causing the sample to emit a current. The sample can be characterized by having a turn-on field that is less than about 10 V/μm (for example, less than about 1.4 V/μm), and a threshold field that is less than about 20 V/μm (for example, less than about 2.2 V/μm). The turn-on field is defined as the electric field (bias voltage divided by the tip-to-anode spacing) for which a current density of 0.01 μA/mm² is produced, and the threshold field is defined as the field at which a current density of 0.1 μA/mm² is produced. The method can be used in a microwave source, a mass spectrometer, a pressure sensor, an acoustic intensity sensor, and/or a displacement sensor.

Also described herein is a device for absorbing electromagnetic radiation. The device includes a semiconductor, with band gap energy $E_{bg}$, for absorbing electromagnetic radiation of frequency less than $E_{bg}$ divided by Planck's constant. The semiconductor is microstructured to have a plurality of cone-like structures formed thereon by laser light. The device can optionally have a housing for disposing the semiconductor therein or thereon. For example, the system can include a sample composed of primarily microstructured silicon for absorbing electromagnetic radiation having a wavelength greater than about 1.05 micrometers. The system can also include a load coupled to the sample to receive energy derived from the electromagnetic radiation absorbed by the sample.

Also described herein is a system for emitting an electric current. The system includes an electric field generator for producing an electric field, and a microstructured sample for emitting an electric current when exposed to the electric field. The system also can include a load for receiving the electric current and for producing a signal responsive to the received electric current. For example, the system and load can be made suitable for use in at least one of a microwave source, a mass spectrometer, a pressure sensor, an acoustic intensity sensor, and a displacement sensor.

BRIEF DESCRIPTION OF THE DRAWINGS

FIGS. 12A-D show the photoluminescence obtained from samples made with different numbers of laser shots per unit surface area.

DETAILED DESCRIPTION OF THE INVENTION

Microstructured samples, such as those composed of primarily silicon having a plurality of cone-like structures formed thereon by laser light, have many applications, which include their use in light absorbing devices, such as solar cells, photodetectors, and other photovoltaic devices. Other applications include field emission devices, such as cathode-ray and panel displays, microwave sources, mass spectrometers, and pressure, acoustic intensity and displacement sensors. Still another application of microstructured samples is their use in luminescence devices. These applications are herein discussed with reference to example embodiments illustrated by FIGS. 1 through 19. It should be understood that many alternative forms could embody the present invention. One of ordinary skill in the art will additionally appreciate different ways to alter the parameters of the embodiments disclosed, such as the size, language, interface, or type of elements or materials utilized, in a manner still in keeping with the spirit and scope of the present invention.

Figure 1:
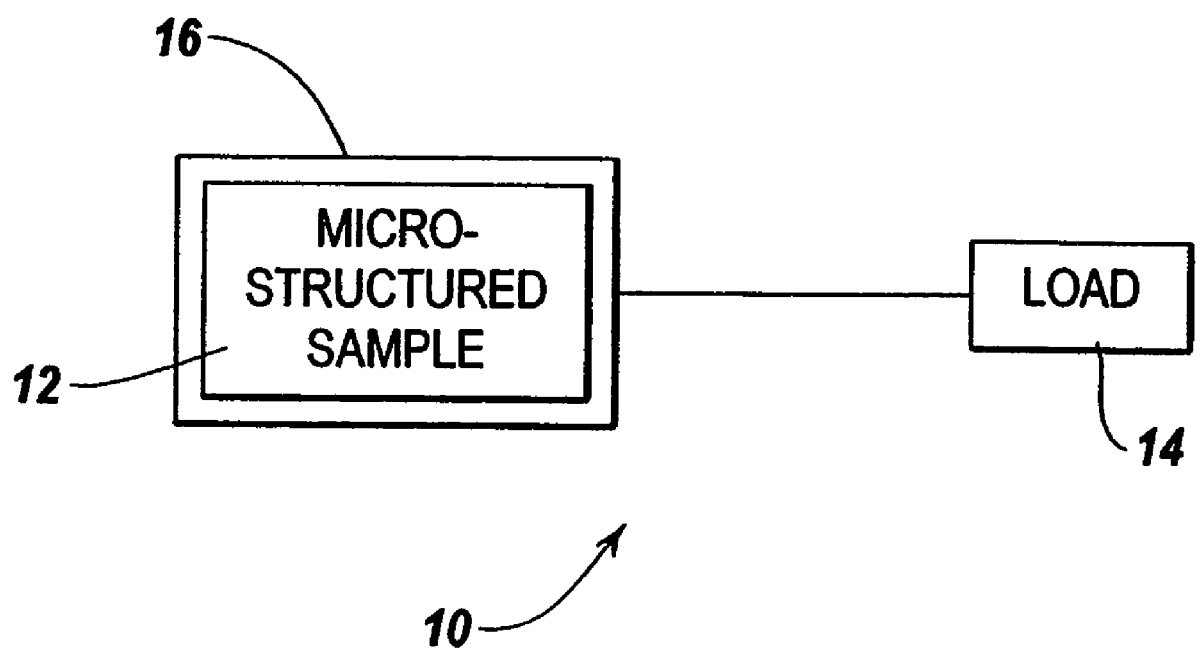
FIG. 1 shows an IR absorbing system according to the teachings of the present invention.
Figure 2A:
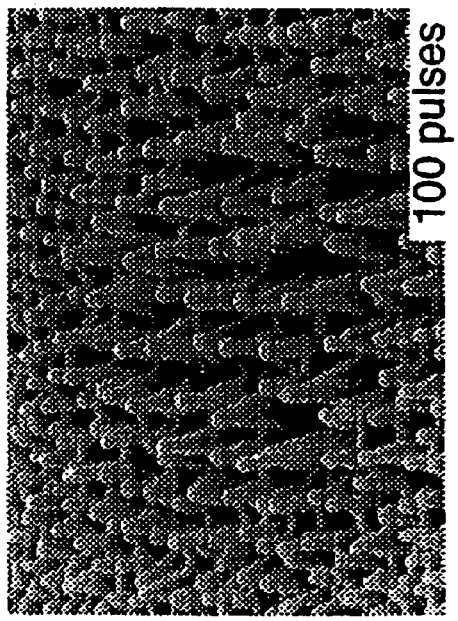
FIGS. 2A-D shows scanning electron micrographs of a silicon surface after ten, twenty-five, one hundred, and four hundred fifty laser pulses according to the teachings of the present invention.
Figure 2C:
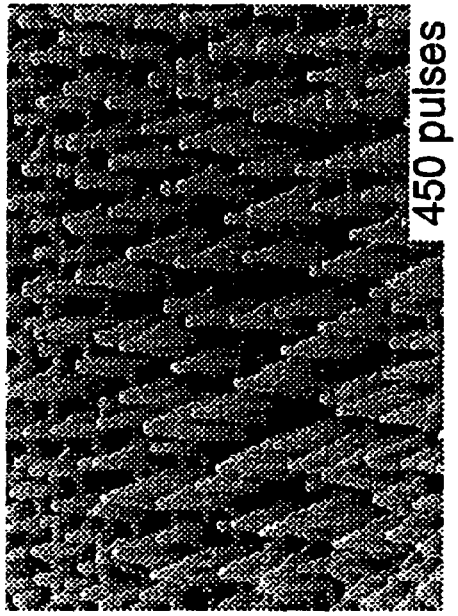
Figure 2B:
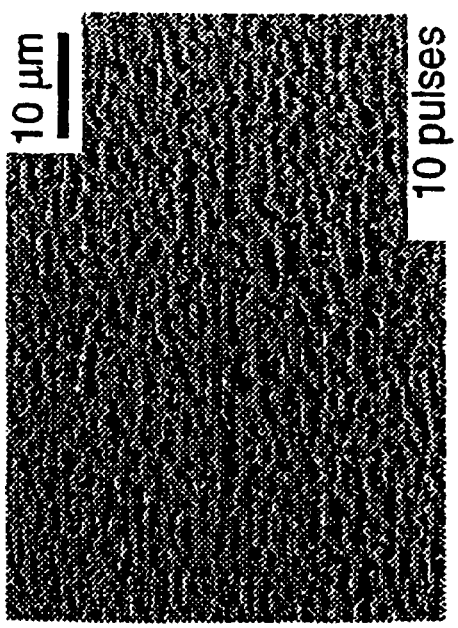
Figure 2D:
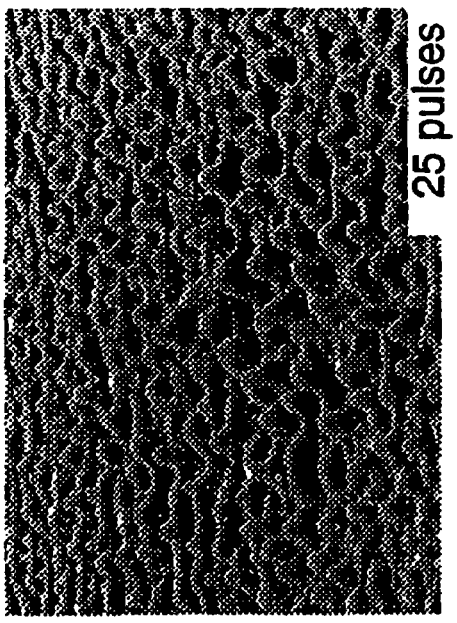

FIG. 1 illustrates an IR absorbing system 10 according to the teachings of the present invention. The system 10 includes a microstructured sample 12 for absorbing light having a wavelength greater than 1.05 micrometers. The microstructured sample 12 contains primarily silicon. As used herein, the term primarily silicon is intended to include any sample or structure that has minor, trace or nominal amounts of one or more other materials. The system 10 further includes a load 14 coupled to the microstructured sample 12 to receive energy derived from light absorbed by the microstructured sample 12. The microstructured sample 12 is mounted within an optional housing 16. The housing can be any structure suitable for mounting, supporting or enclosing the microstructured sample 12. The housing 16 can comprise a single component or a plurality of components that are coupled, connected or secured together.

The sample 12 can include, for example, a silicon sample having a surface that can be microstructured by irradiating the surface with a train of 800 nm, 100 fs laser pulses in the presence of a background gas such as $SF_6$, as described in more detail below. This process creates a quasi-ordered array of sharp conical microstructures up to fifty (50) micron high that are about 0.8 micron wide near the tip and up to ten (10) micron wide near the base. The pattern forms spontaneously without the use of masks, and forms only in the region illuminated by the laser. FIGS. 2A-D show scanning electron micrographs of the surface after ten, twenty-five, one hundred, and four hundred fifty laser pulses with fluence of ten $kJ/m^2$. Areas up to ten mm by ten mm are microstructured by scanning the laser beam across the sample; the laser parameters and scan speed determine the height of the spikes. The formation of the microstructured silicon is further described in Appl. Phys. Lett. 73, 1673-1675 (1998), by Her et al. and Appl. Phys. A 70, 383-385 (2000), by Her et al., the contents of which are herein incorporated by reference.

According to one practice, as contemplated by FIG. 1, the microstructured sample 12 is part of a solar cell. In this embodiment, the microstructured sample 12 absorbs sunlight having a wavelength greater than about 1.05 micrometers. The solar cell is devised to convert light to electric current by using the microstructured sample to absorb sunlight. When sunlight strikes the exposed active surface of the microstructured sample 12, it loosens electrons from their sites in the sample, as known to those of ordinary skill in the art. Some of the electrons can form a current in a circuit that couples the microstructured sample 12 to the load. The load 14 can be a myriad of electronic, mechanical, optical, or electromechanical devices that function when an electric current passes through it, such as a resistor, light bulb, display, and the like.

In another embodiment as contemplated by FIG. 1, the microstructured sample 12 is part of a photovoltaic cell, such as that used in a photodetector. The microstructured sample 12 absorbs light having a wavelength greater than about 1.05 micrometers. The light absorbed by the microstructured sample produces a signal that is input by the load 14 to indicate the intensity of the absorbed light. The load 14 in this embodiment can include a microprocessor and display, such as a computer screen. The microprocessor, and other electronic devices known to those of ordinary skill in the art, can utilize the signal to indicate the intensity of the absorbed light on the display.

Figure 3:
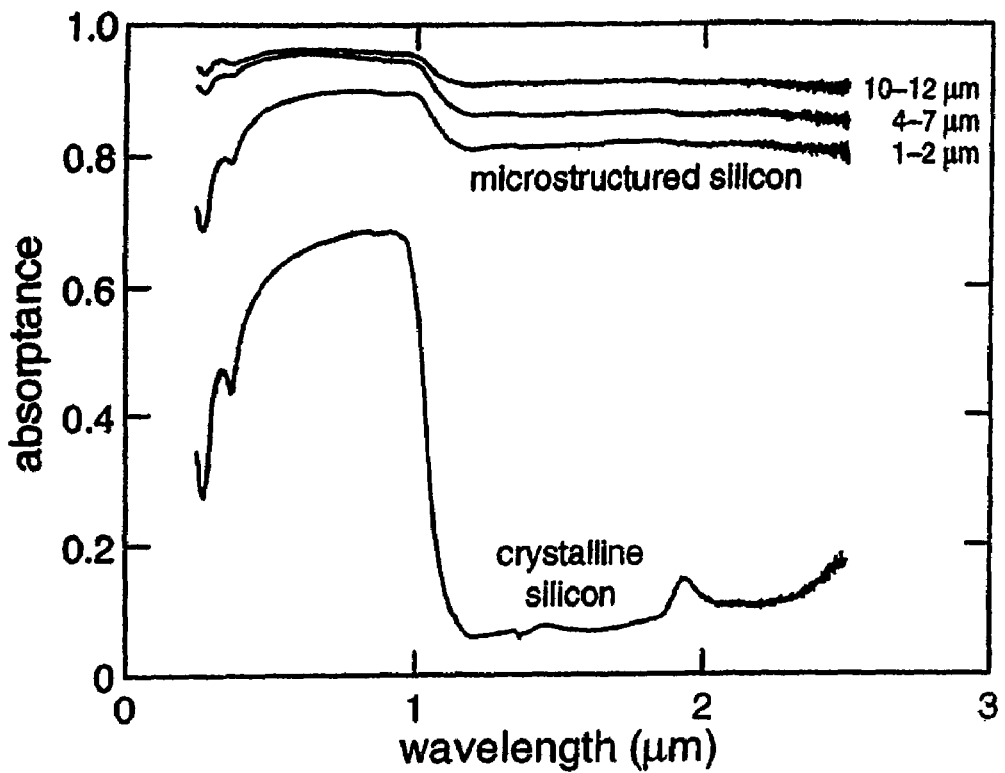
FIG. 3 shows a plot of absorptance versus wavelength for a conventional crystalline silicon sample, and for three microstructured silicon samples having spike heights of 1-2 micrometers, 4-7 micrometers, and 10-12 micrometers.

Referring to FIG. 3, a plot of absorptance versus wavelength is shown for a conventional crystalline silicon sample, and for three microstructured silicon samples having spike heights of 1-2 micrometers, 4-7 micrometers, and 10-12 micrometers. The height of the peaks of the last three samples can be achieved with the use of $SF_6$ as a background gas, and using various laser fluences, and translation speeds of the laser spot across the sample as the structures are formed.

Even for areas patterned with the smallest microstructures, only 1-2 micrometers tall, the optical absorptance over the wavelength range 250 nm<$\lambda$<2.5 μm is substantially greater than that of flat, crystalline silicon. For wavelengths between 500 nm and 1.1 μm, the absorptance for these small microstructures is as high as 0.9. The absorptance drops at the band edge, as it does for flat silicon, but even for these longer wavelengths, $\lambda$>1.1 μm, the absorptance is greater than 0.8, or more than five times the absorptance of the flat, crystalline silicon. As the heights of the structures increase, so does the optical absorptance, both below and above the band gap. For the tallest microstructures studied, with heights of 10-12 μm, the absorptance is approximately 0.9 or greater across the entire wavelength region investigated. This represents a remarkable increase in absorptance compared with flat silicon, especially for infrared wavelengths 1.1 μm<$\lambda$<2.5 μm.

Figure 4:
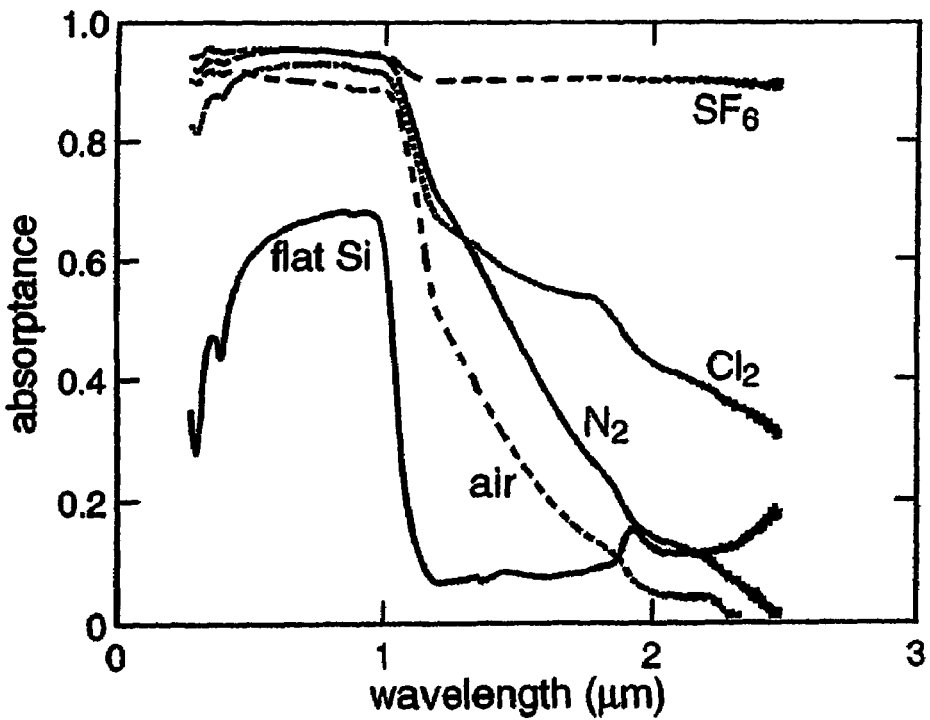
FIG. 4 shows the absorptance of silicon samples prepared in $SF_6$, $Cl_2$, $N_2$, and air according to the teachings of the present invention.

Background gases other than $SF_6$ can also be used. Referring to FIG. 4, the absorptance of samples prepared in $SF_6$, $Cl_2$, $N_2$, and air is shown. Absorptance increases for all of these samples, as compared to a conventional crystalline silicon sample, for all the gases used. Although samples fabricated in any of the gases show an increase in infrared absorption over ordinary crystalline silicon, the effect is strongest for structures formed in the presence of $SF_6$: the absorptance is approximately 0.9 in the wavelength region 1.2-2.5 μm. Structures made in $Cl_2$ show an absorptance of 0.3-0.9 in this wavelength region, while for unmodified silicon, the absorptance at these infrared wavelengths is less than 0.2. Surfaces structured in air or $N_2$ are less effective absorbers than those made in halogen-containing gases in the wavelength range $\lambda$>0.5 μm for air and $\lambda$>1.3 μm for $N_2$. Furthermore, they show lower infrared absorptance than flat silicon for long wavelengths ($\lambda$>1.9 μm for air and $\lambda$>2.2 μm for $N_2$).

Figure 5:
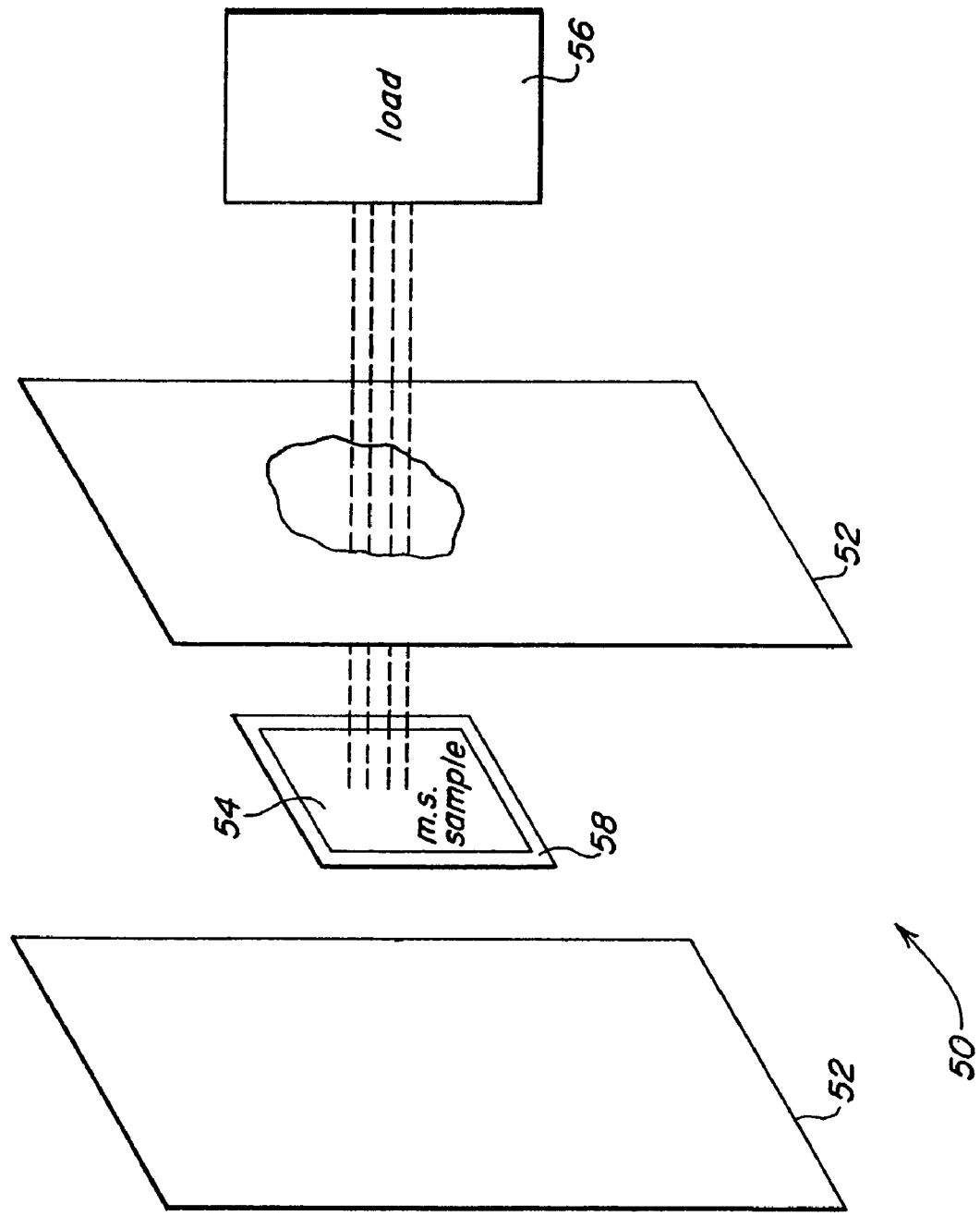
FIG. 5 shows a current emission system according to the teachings of the present invention.

Referring to FIG. 5, a current emission system 50 is shown according to the teachings of the present invention. The current emission system 50 includes an electric field generator 52, a microstructured sample 54, and a load 56. The current emission system can also include a housing 58 for housing the microstructured sample 54.

The electric field generator 52 produces an electric field, which is applied to the microstructured sample 54. The applied electric field causes the microstructured sample to emit an electric current. The load receives the electric current, and produces a signal responsive to the received electric current.

The emitted field can be used in many devices, such as a display, a microwave source, a mass spectrometer, a pressure sensor, an acoustic intensity sensor, and a displacement sensor, as known to those of ordinary skill in the art. For example, the load can be suitable for use in a display. In this case, the load can include a screen containing luminescent material. When the current emitted from the microstructured sample 54 strikes a portion of the screen, the luminescent material in that portion of the screen luminesces. By judiciously striking portions of the screen, an image can be made to appear on the screen.

Figure 6A:
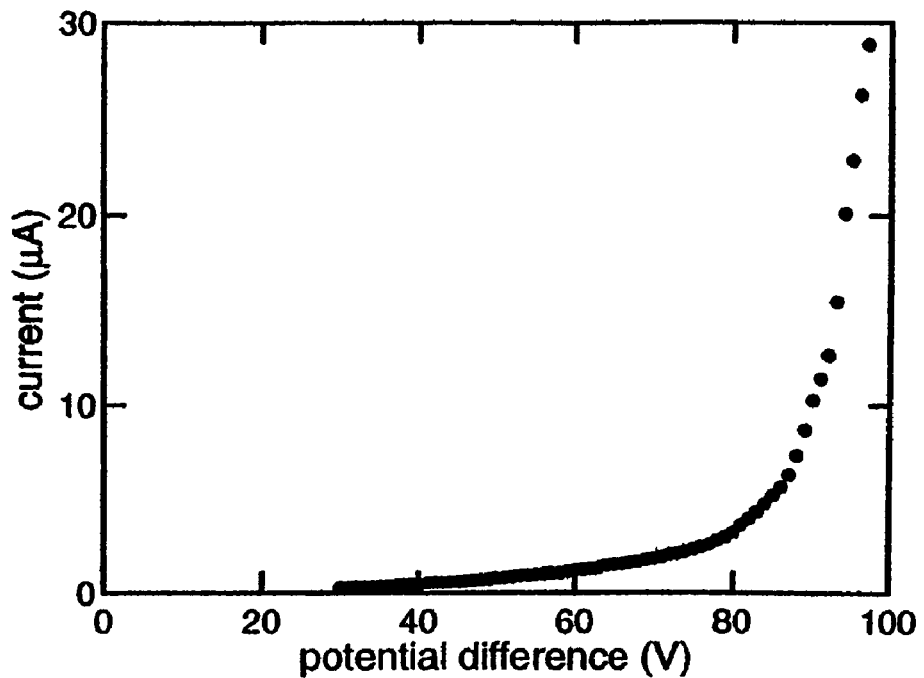
FIGS. 6A-B show a plot of the field emission current measured as a function of applied bias voltage according to the teachings of the present invention.
Figure 6B:
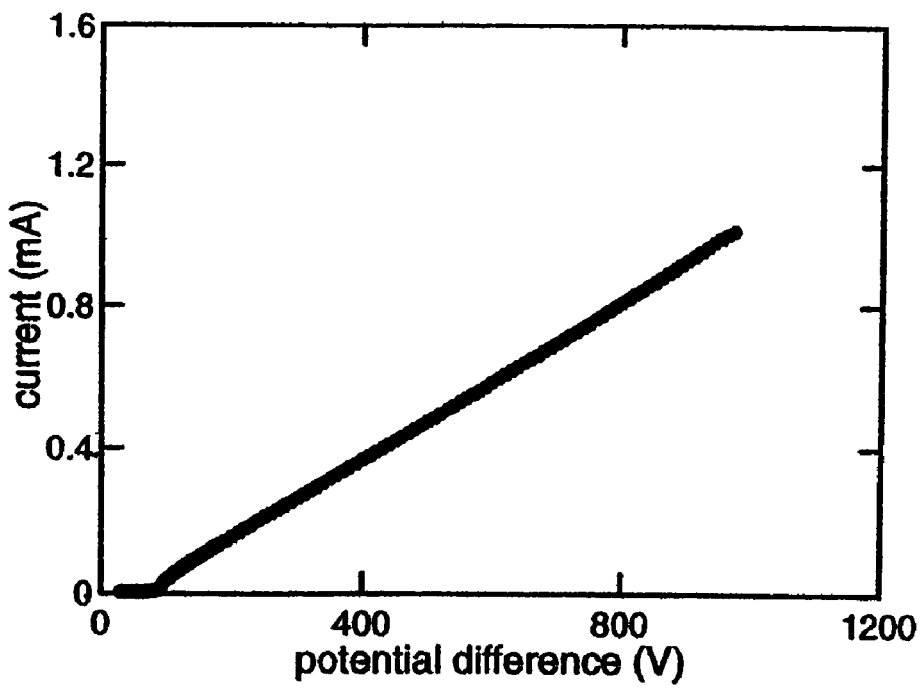

Referring to FIGS. 6A and 6B, a plot of the field emission current measured as a function of applied bias voltage for a 2 mm×2 mm sample of conical microstructures formed in $SF_6$. The separation between the structured sample and the anode is 20 μm.

The low-voltage region shown in FIG. 6A shows the exponential increase in current (I) as a function of bias voltage (V). For the higher-voltage region (V>100 V), FIG. 6B shows that the relationship becomes linear. That is, for high bias voltages, the response of the circuit becomes ohmic, with the slope of the I-V graph equal to the reciprocal of the resistance of the protection resistor.

Field emitters are often characterized by the field needed to create measurable emission current (the "turn-on field") and the field needed to create a substantial emission current (the "threshold field"). For the present devices, the turn-on field, defined as the electric field (bias voltage divided by the tip-to-anode spacing) for which a current density of 0.01 μA/mm$^2$ is observed, is 1.3 V/μm. The threshold field, defined as the field at which a current density of 0.1 μA/mm$^2$ is produced, is 2.15 V/μm.

The photocurrent properties of microstructured samples that arise from current emission can also be explored using avalanche photodiodes (APD), such as those available from Radiation Monitoring Devices, Inc., Watertown, Mass. An APD is a strongly biased photodiode and is several orders of magnitudes more sensitive than ordinary photodetectors. In an APD, photocarriers produced by absorption of photons, are multiplied in an avalanche process: a high reverse bias (typically>1000 V) provides a strong electric field in the junction region. Photocarriers entering the region are accelerated in the high electric field. If the acquired energy is larger than the band gap energy, these carriers can create additional electron-hole pairs by impact ionization. The generated carriers can produce more carriers if the energy they acquire in the electric field is sufficient. The result is a cascade of carriers. Typically, one photon can create several thousand electron-hole pairs in an APD. APD measurements can be performed by Radiation Monitoring Devices, Inc.

The quantum efficiency of ordinary silicon avalanche photo diodes drops rapidly towards zero for wavelengths longer than 1 μm due to the absorption edge of silicon at 1.1 μm. The quantum efficiency of a 1×1 mm$^2$ APD pixel fabricated by Radiation Monitoring Devices™ as a function of illumination wavelength can be measured. At 1.06 μm, for example, the quantum efficiency is 22% and drops quickly to below 1% for longer wavelengths.

Figure 7:
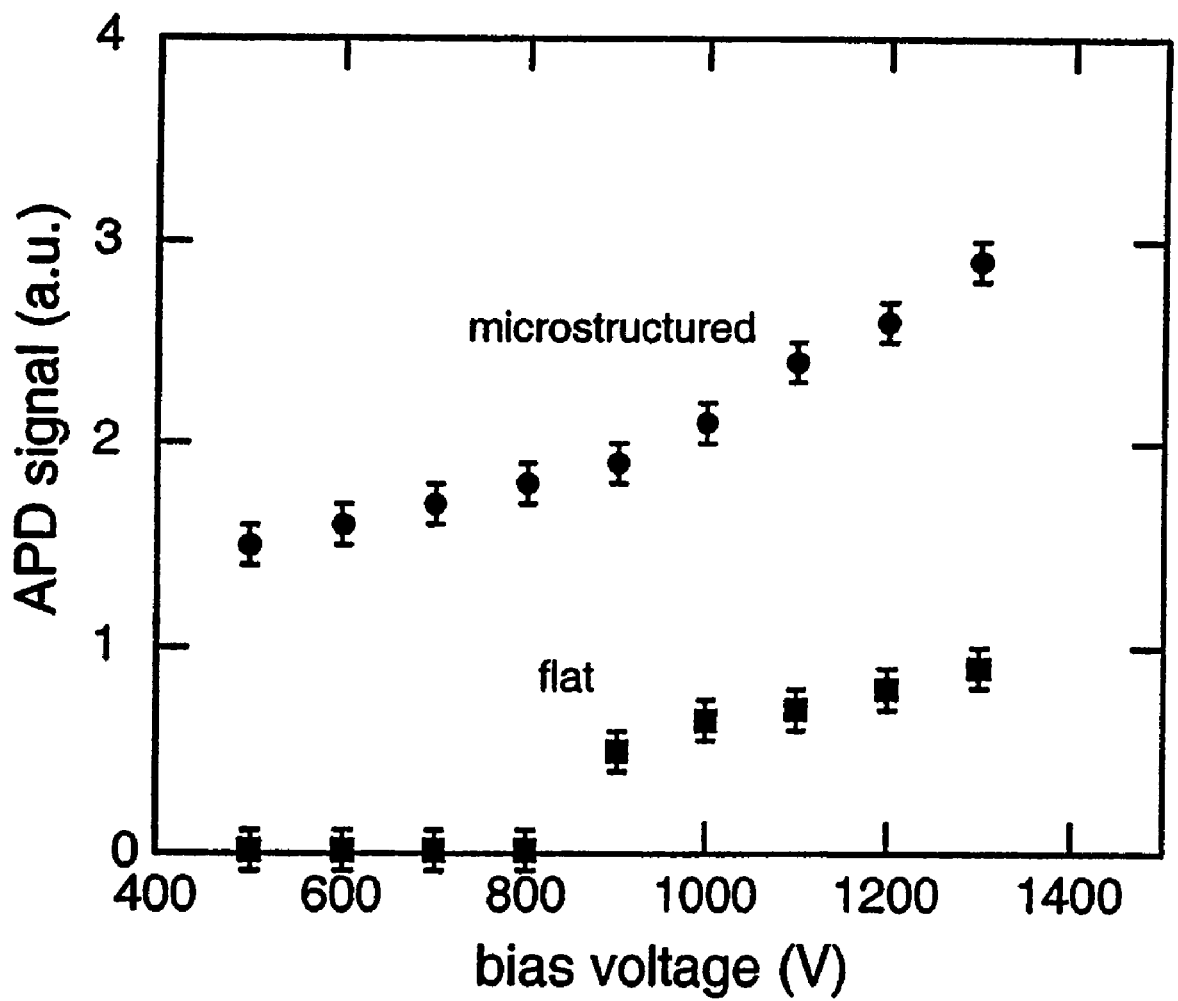
FIG. 7 compares the response of a flat (crystalline) and spiked (microstructured) surface arising from irradiation with 1.31 μm light according to the teachings of the present invention.

FIG. 7 compares, using plots of APD signal versus bias voltage, the response of a flat (crystalline) and spiked (microstructured) APD surface arising from irradiation with 1.31 μm light. The APD samples were specially designed to test below-band gap photocurrent from the spiked surface. The APDs were not passivated neither by hydrogenation nor by oxide stripping. One-half (1×2 mm) of the sample was microstructured, the other half was not microstructured. The response of the device is measured upon illumination with light from a pulsed Nd:YAG laser (1.06 μm—plot not shown) and with light from a 1.31 μm laser diode (continuous wave, chopped at 100 Hz) of the microstructured and flat parts respectively. The laser beam was focussed with a 0.05 m focal length lens onto the sample such that an area of <0.2 mm$^2$ was illuminated. The light was chopped via triggering of the laser diode with a TTL wave produced with a function generator. As can be seen from FIG. 7, the structured APDs show a more than threefold increase in quantum efficiency of radiation at 1.31 μm. Similar results hold for the 1.06 μm light.

Figure 8:
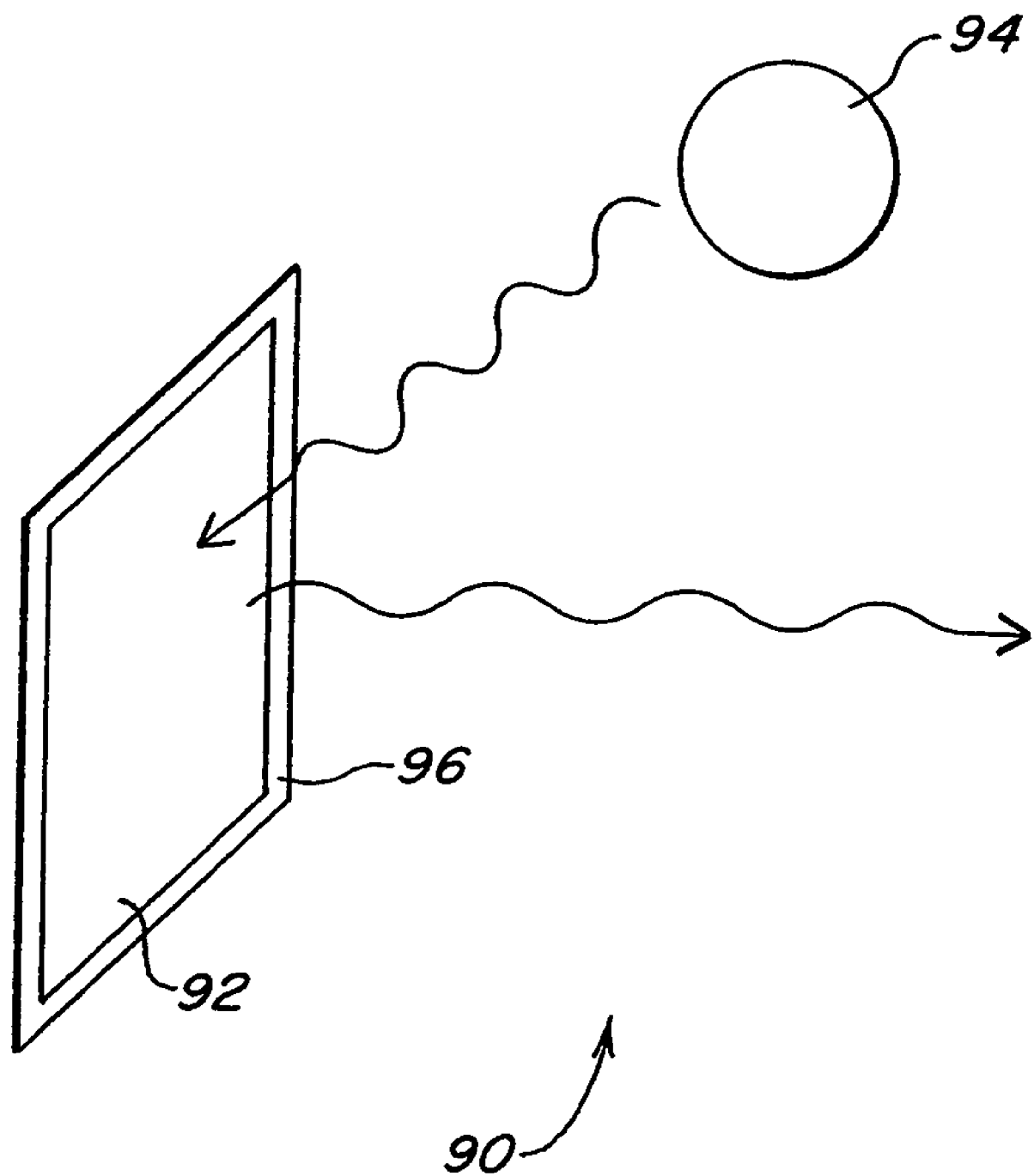
FIG. 8 shows a luminescent system for emitting luminescent light according to the teachings of the present invention.
Figure 9A:
FIGS. 9A-D show samples as seen under the scanning electron microscope (SEM) at a 45° angle.
Figure 9C:
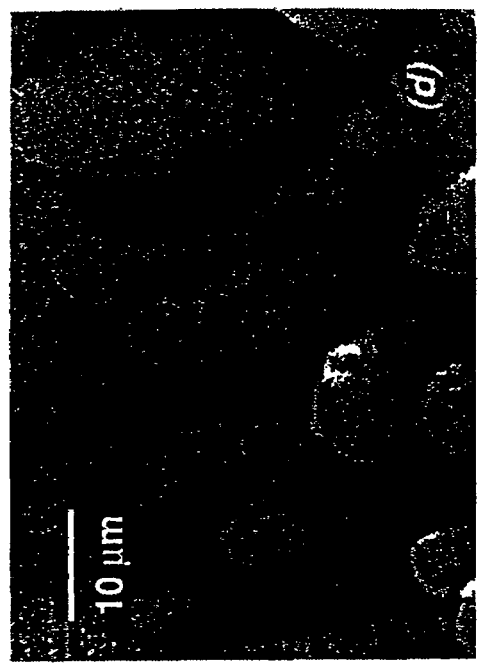
Figure 9B:
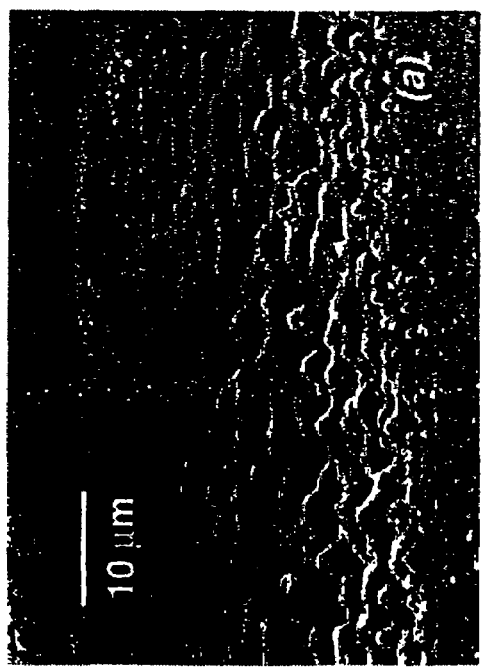
Figure 9D:
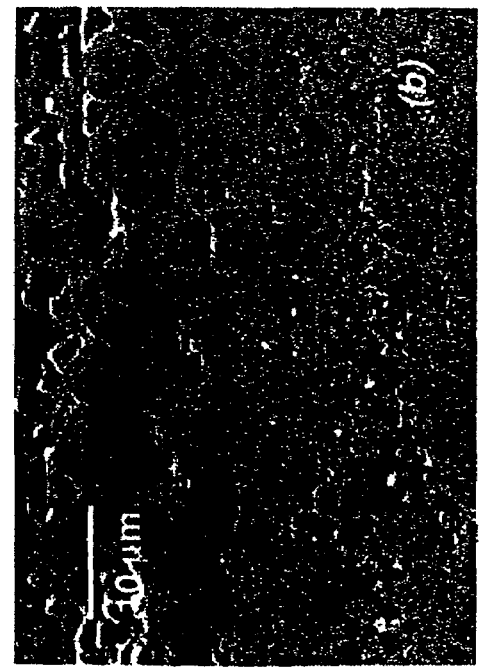

Referring to FIG. 8, a luminescent system 90 for emitting luminescent light is shown according to the teachings of the present invention. The luminescent system 90 includes a microstructured sample 92. The luminescent system 90 can also include a light source 94 for producing light having a wavelength greater than about 1.1 micrometers, and a housing 96 for housing the microstructured sample 92.

The microstructured sample 92 absorbs light from the light source 94. In response to absorbing the light, the microstructured sample 92 produces luminescent light having a wavelength in the range 500-800 micrometers. Such luminescent light can be used in a myriad of applications, such as the lighting of instrument dials at night, and in aesthetic or entertainment illumination systems.

The amount of luminescence produced by the microstructured silicon depends on the laser fluence, number of laser shots, and amount of annealing. Three series of samples were produced (series A, series B, series C) under the following conditions:

Series A: Variation of Laser Fluence

In series A, 4 samples were patterned using fluences of 2.5 kJ 1 m2, 5 kJ 1 m2, 10 kJ 1 m2, and 30 kJ 1 m2 respectively. The laser scan speed was 50 μm/s.

Series B: Variation of Number of Laser Shots

In series B, the average number of laser shots per unit area was changed by varying the sample translation velocity and the number of scans over the samples. The average number of laser shots per unit area decreases with increasing scanning speed and increases with increasing number of scans. The average number of laser pulses per unit surface area is roughly $n_{avg}=SfN/v$, where S is the laser spot size, v the scan velocity, f the repetition rate of the laser and N the number of scans.

Two samples were produced with a single scan using a laser spot size of 100 μm and a scan velocity of 100 μm/s ($n_{avg}=1000$) and 50 μm/s ($n_{avg}=2000$) respectively. Two more samples were made by scanning over the sample twice using the same laser spot size with a scan velocity of 50 μm/s ($n_{avg}=4000$) and 100 μm/s ($n_{avg}=2000$) respectively. For all samples, the fluence used was 2.5 kJ/m².

Series C: Annealing

In series C, two sets of samples were patterned using a scan velocity of 100 μm/s. Four of these samples were produced using a fluence of 7.5 kJ/m² (series $C_1$) and 4 samples were produced using a fluence of 15 kJ/m² (series $C_2$). After patterning, one sample of each set was annealed at 1300 K in vacuum (P=10⁻⁷ Torr) for 30 minutes, 60 minutes, and 3 hours respectively. The remaining two samples were not annealed and served as reference samples. In addition, the sample from series A made with a fluence of 30 kJ/m² and a scan speed of 50 μm/s was annealed for 5 hours at 1300 K.

Series A Results:

FIGS. 9A-D show the series A samples as seen under the scanning electron microscope (SEM) at a 45° angle. As the fluence used to structure the surface increases from 2.5 kJ/m² to 30 kJ/m², the surface morphology changes from a rippled structure to cones. Noteworthy here is that the structures are covered with many nanometer-scale particles (hereafter "nanoparticles"). These particles could be silicon aggregates produced during material removal of the surface and then redeposited.

Figure 10A:
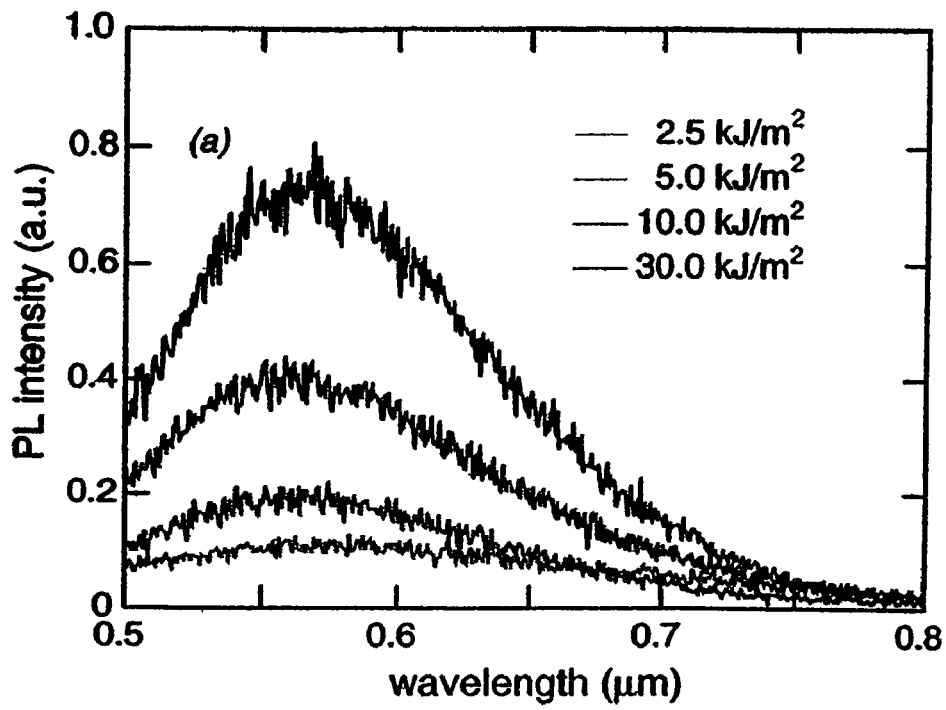
FIG. 10A shows the photoluminescence of samples.

FIG. 10A shows the photoluminescence of the samples from series A. A green luminescence band is observed centered at around 560 nm. The photoluminescence intensity increases with increasing laser fluence while the peak wavelength does not vary.

Figure 10B:
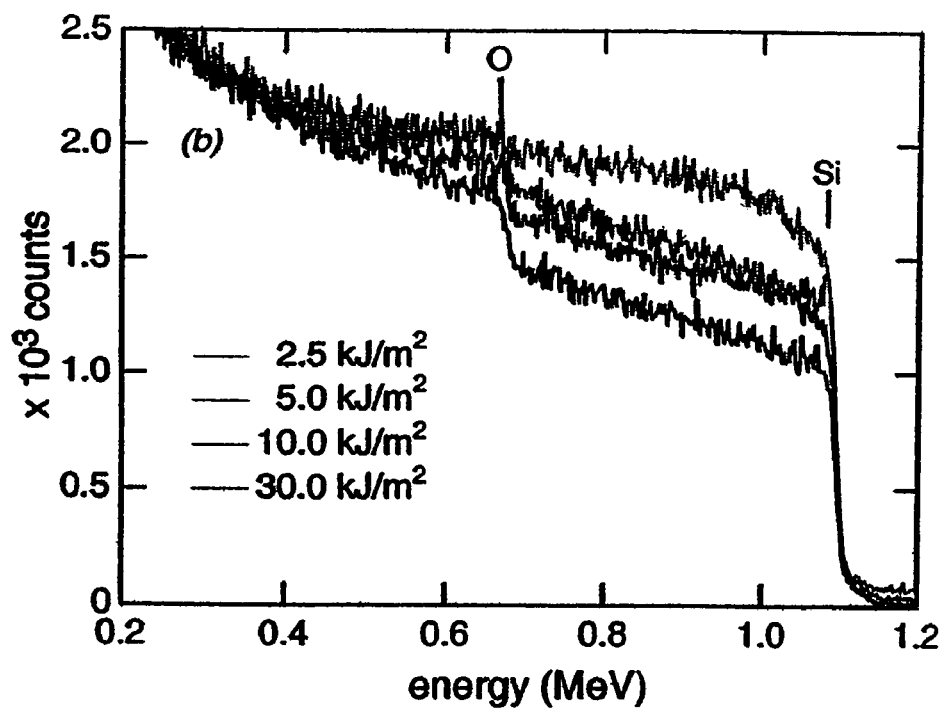
FIG. 10B shows Rutherford Backscattering Spectrometry spectra of samples.

Rutherford Backscattering Spectrometry (RBS) reveals that the oxygen content of the samples increases with increasing laser fluence; the RBS spectra for the four samples appear in FIG. 10B. The increase in oxygen content is indicated both by the growth of the oxygen peak and the decrease of the silicon signal (which includes both the silicon surface and the background signal). Simulation of the RBS spectra with the program RUMP™ shows that the oxygen concentration decreases with depth.

Figure 11A:
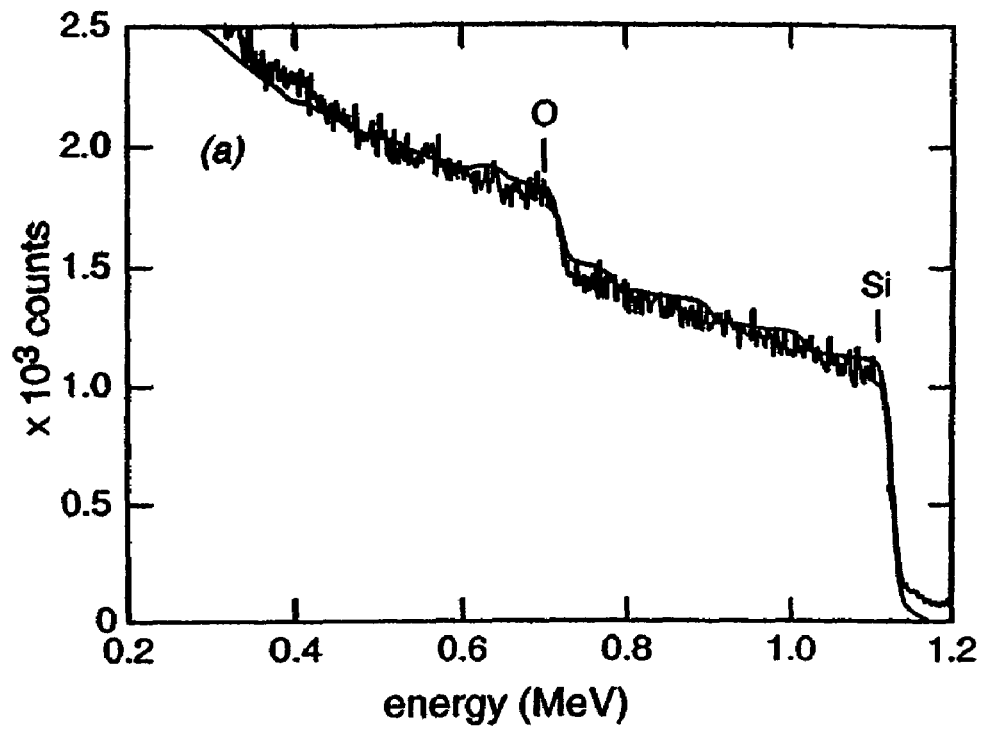
FIG. 11A shows a fit for a sample made with 30 $kJ/m^2$ fluence.

FIG. 11A shows the fit for the sample made with 30 kJ/m² fluence. The fit was produced using a layered profile with a decrease in oxygen concentration with increasing depth. The profile details of this simulation are given in the following table:

| Layer No. | O/Si |
|---|---|
| 1 | 0.81 |
| 2 | 0.66 |
| 3 | 0.53 |
| 4 | 0.42 |
| 5 | 0.33 |
| 6 | 0.28 |
| 7 | 0.21 |
| 8 | 0.11 |

Figure 11B:
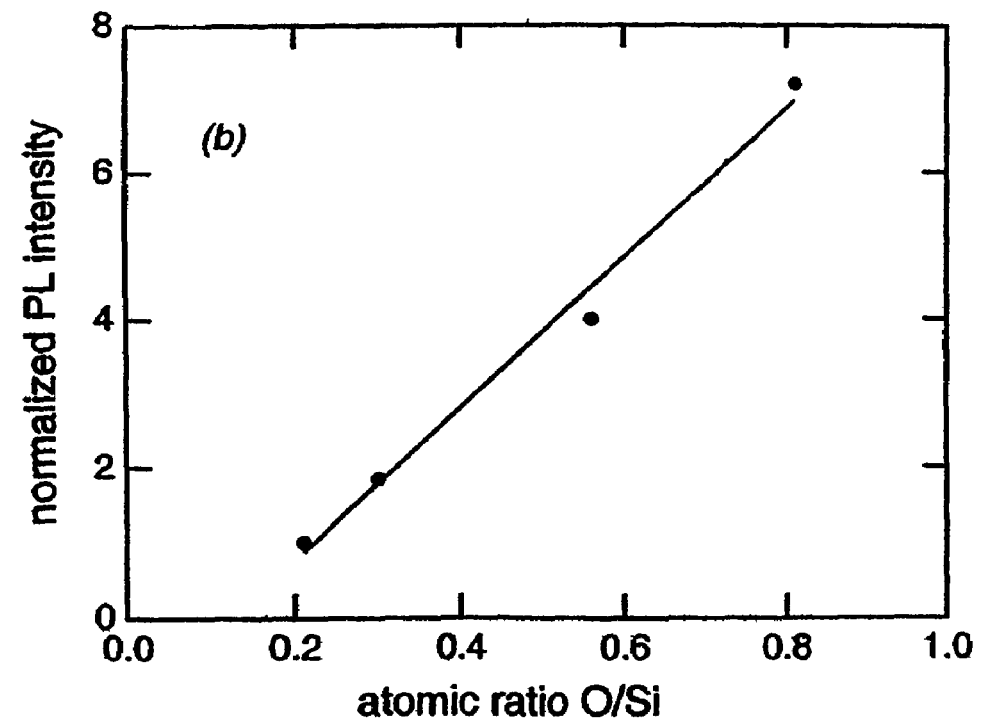
FIG. 11B shows the photoluminescence intensity of samples versus surface oxygen concentration.

Column 2 shows the atomic ratio of oxygen to silicon in the layers. Plotting the photoluminescence intensity versus surface oxygen concentration of the four samples made with different laser fluence, yields a linear dependence of the luminescence intensity on surface oxygen content. FIG. 11B shows the photoluminescence intensity of the four samples (normalized to that of the 2.5 kJ/M² sample) versus surface oxygen concentration.

As shown by RBS, increasing the laser fluence increases the oxygen content in the samples. This may be associated with the fact that a higher fluence causes a greater increase in the surface temperature and a larger melt depth upon laser irradiation, because more energy is deposited in the surface during the duration of the laser pulse. The diffusion coefficient of oxygen in liquid silicon increases by six orders of magnitudes compared to that of solid silicon. Therefore, with higher laser fluence, a thicker layer can be oxidized. The linear increase of the photoluminescence intensity with the oxygen content indicates that doubling the number of oxygen sites doubles the number of luminescence centers.

Series B Results:

FIGS. 12A-D shows the photoluminescence obtained from the samples made with different numbers of laser shots per unit surface area. The laser peak wavelength blue-shifts with increasing exposure to laser pulses. The photoluminescence peak wavelength is 520 nm using a velocity of 50 μm/s and scanning twice over the samples, 540 nm using the same velocity and a single scan, 560 nm using a velocity of 100 μm/s and two scans, 630 nm using a velocity of 100 μm/s and a single scan.

The number of laser shots per unit surface area to which the surface is exposed, is related to the oxidation time. In conventional thermal oxidation, the surface first oxidizes by forming $SiO_x$, with x<2, which then gradually evolves into $SiO_2$ with increasing oxidation time. A blue-shift of the photoluminescence peak is observed with increasing number of laser shots. In comparison to thermal oxidation, the observed shift of the peak wavelength may be due to a changing stoichiometry of $SiO_2$ with increasing number of laser pulses.

Figure 13A:
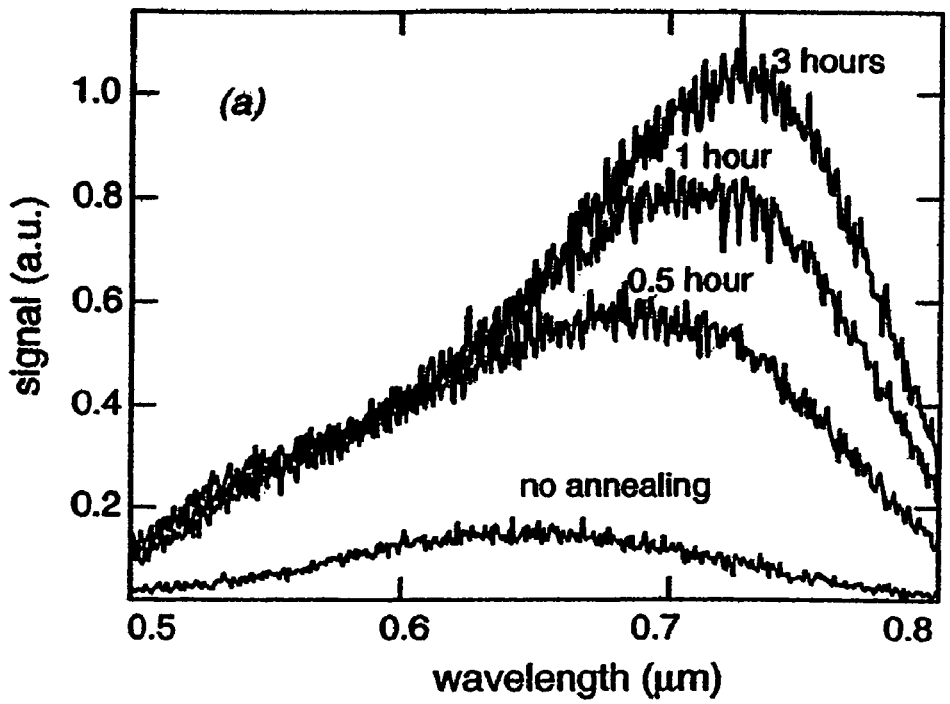
FIG. 13A shows a photoluminescence spectra before and after annealing, and FIG. 13B compares the photoluminescence of samples.

Series C Results:

Annealing changes the photoluminescence spectra drastically. FIG. 13A shows the photoluminescence spectra of series $C_2$ (F=15 kJ/m$^2$) before annealing and after annealing for 0.5 hour, 1 hour, and 3 hours in 1300 K respectively. Prior to annealing, the spectrum exhibits a red band centered at 630 nm and no green band is visible. Three changes occur in the photoluminescence spectrum with increasing annealing time: 1. The photoluminescence intensity increases. 2. The red peak shifts to longer wavelengths. 3. A green luminescence peak appears and grows.

Figure 13B:
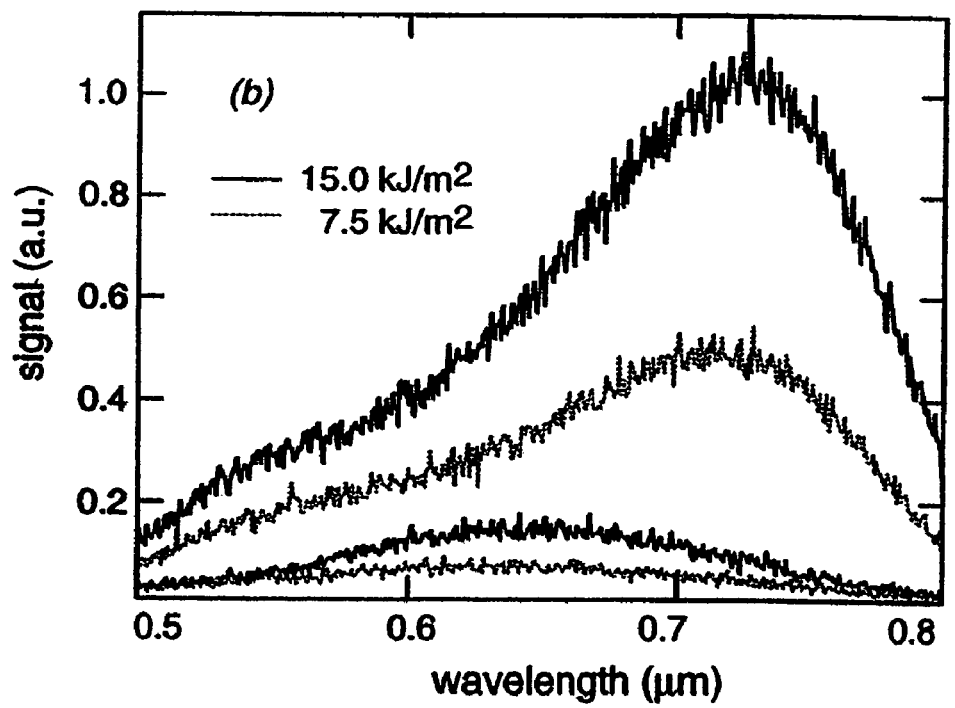

FIG. 13B compares the photoluminescence of the samples made with F=7.5 kJ/m$^2$ and F=15 kJ/m$^2$ after 3 hours anneal. The luminescence intensity of the sample made with F=7.5 kJ/m$^2$ is lower than that made with F=15 kJ/m$^2$, as is expected from the fluence dependence results of series A. This is unchanged by the anneal. Unlike the samples from series C, the sample from series A exhibits a green band centered at 560 nm and no peak in the red before annealing.

Figure 14:
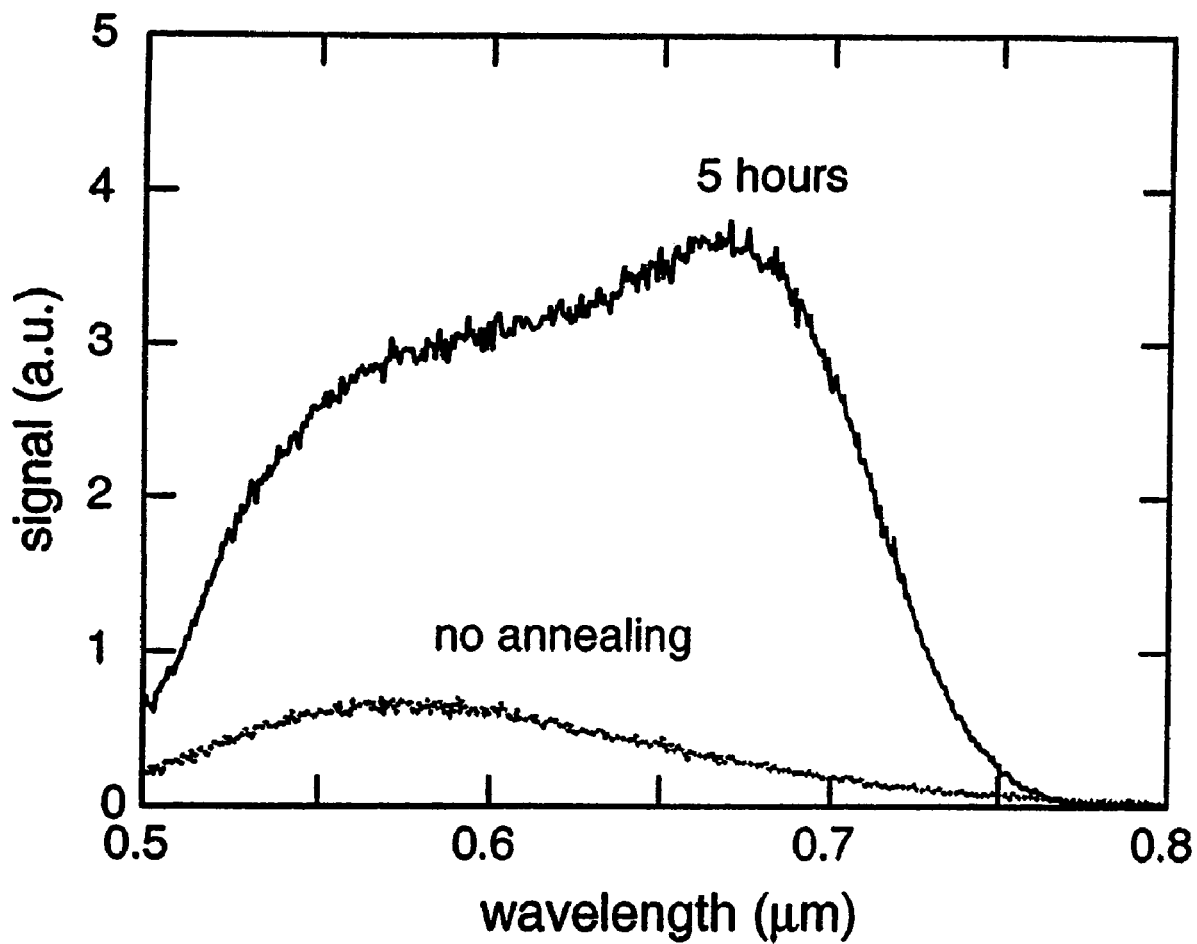
FIG. 14 shows the photoluminescence after 5 hours of annealing in vacuum at 1300 K.

FIG. 14 shows the photoluminescence after 5 hours of annealing in vacuum at 1300 K. The annealing increases the photoluminescence intensity of the green band by a factor of 4. This time, a red band appears upon annealing. Scanning electron microscopy of both series A and series C samples reveals that most of the nanoparticles are removed after annealing, leaving a much smoother surface.

Figure 15:
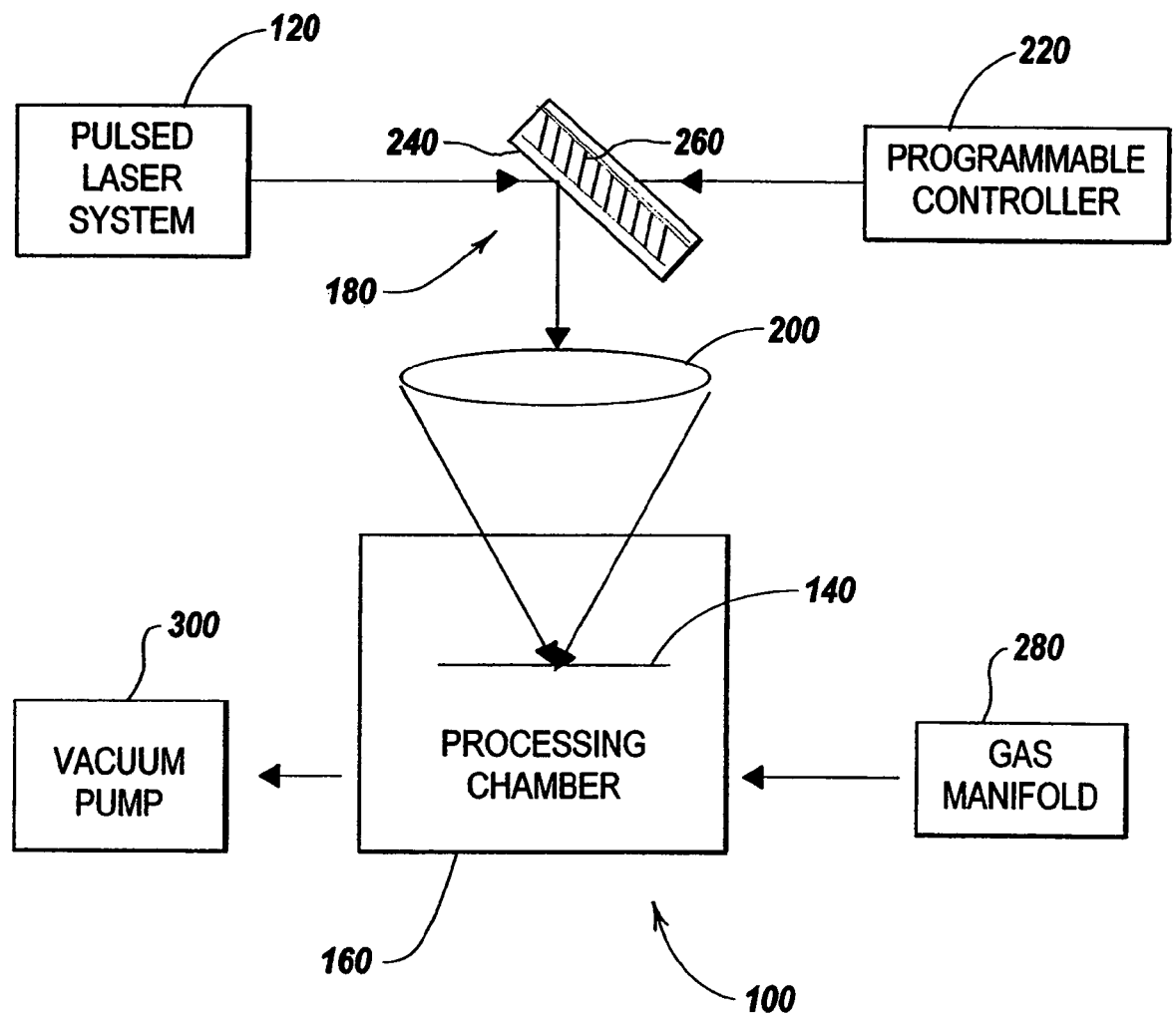
FIG. 15 shows a block diagram illustrating an apparatus for fabricating microstructured silicon active elements in accord with the present invention.

Referring now to FIG. 15, generally designated at 100 is a block diagram illustrating apparatus for fabricating microstructured silicon active elements in accord with the present invention. The apparatus 100 includes a pulsed laser system 120 optically coupled to a substrate 140 mounted in a processing chamber 160 along an optical path that includes a translation system generally designated 180 and a focusing objective 200. In the presently preferred embodiment, the pulsed laser system 120 includes a Ti:sapphire oscillator and a chirped-pulse-regenerative amplifier producing a 1 kHz train of 100 fs, 0.5 mJ pulses at 800 nm, although other pulsed and/or continuous wave microstructuring laser systems could be employed. In the presently preferred embodiments, a silicon substrate 140 is microstructured, although other semiconductor or other substrates could be employed. In the presently preferred embodiment, the focusing objective 200 is a 0.15-m focal-length lens, although other refractive or reflective objectives could be employed.

A programmable controller 220 is operatively connected to the translation system 180 for controllably directing the output of the pulsed laser system 120 to different, pre-selected points on the surface of the substrate 140. In the presently preferred the translation system 180 includes a specular member 240 and a two-degree-of-freedom actuator 260 controlled by the programmable controller 220. The optics 200 move in accord, although any otter means for displacing the output of the pulsed laser system 120 relative to the substrate 140 in the processing chamber 160, such as an X, Y translation stage coupled to the processing chamber 160 and controller 220, may be employed.

A gas manifold 280 is operatively coupled to the processing chamber 160 for controllably injecting ambient(s) into the chamber 160, and a vacuum pump 300 is operatively coupled to the processing chamber 160.

Figure 16:
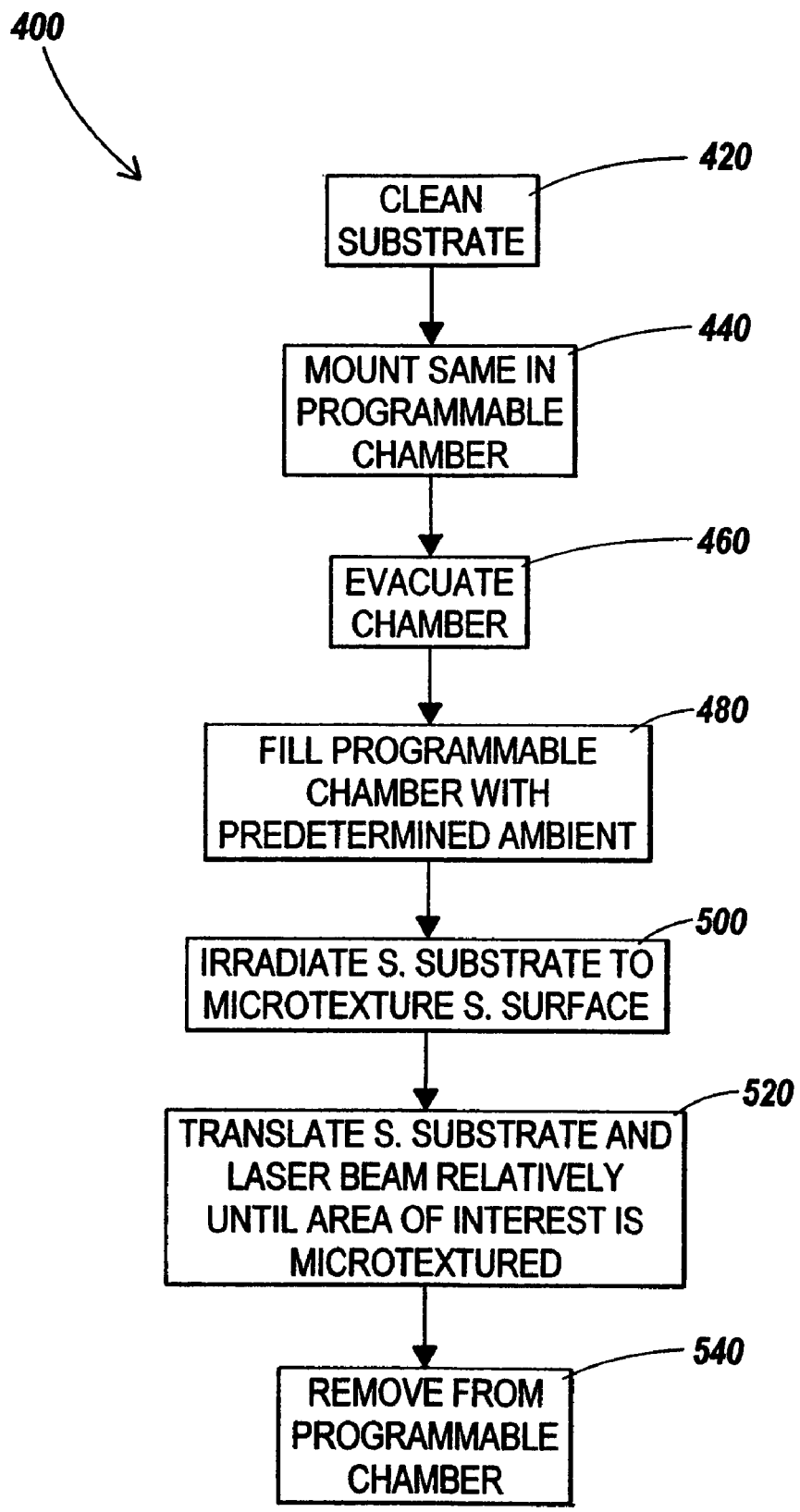
FIG. 16 shows a flowchart for fabricating devices having microstructured silicon active elements in accord with the present invention.

Referring now to FIG. 16, generally designated at 400 is a flowchart useful in explaining the operation of the apparatus of FIG. 15 to fabricate devices having microstructured silicon active elements in accord with the present invention. As shown by block 420, the silicon substrate is cleaned prior to irradiation by immersion in trichloroethylene with ultrasound for ten (10) minutes, followed by immersion in acetone with ultrasound for ten (10) minutes, followed by immersion in methanol with ultrasound for ten (10) minutes. The substrate is then removed from the solvent and blow-dried with nitrogen gas.

As shown by block 440, the silicon substrate is then mounted in the processing chamber. Preferably, the silicon substrate is mounted on a thin metal plate with conducting carbon tape.

As shown by block 460, the processing chamber is then evacuated, preferably to $10^{-6}$ Torr. When air is the predetermined background gas, it may not be necessary to evacuate the processing chamber prior to laser irradiation. As shown by block 480, the processing chamber is then filled with a predetermined background gas through the gas manifold.

To provide infrared absorbing microstructured silicon active elements in accord with the present invention, the predetermined background gas is determined to introduce states in the silicon substrate that absorb infrared energy and produce photocurrent in response thereto. Preferably, the processing chamber is filled with $SF_6$ as background gas to provide infrared absorbing microstructured silicon active elements in accord with the present invention, although other background gases that introduce states in the silicon or other substrate that absorb infrared energy and produce photocurrent in response thereto may be employed without departing from the inventive concepts.

To provide field emitting microstructured silicon active elements in accord with the present invention, the predetermined background gas is determined to incorporate impurities into the silicon substrate that so alter its electronic structure as to enhance its field emission when exposed to an electric field. Preferably, the processing chamber is filled with $SF_6$ as background gas to provide field emitting microstructured silicon active elements in accord with the present invention. Other background gases that incorporate impurities into the silicon or other substrate that so alter its electronic structure as to enhance its field emission when exposed to an electric field may also be employed without departing from the inventive concepts.

To provide luminescent microstructured silicon active elements in accord with the present invention, the predetermined background gas is determined to produce luminescent states in the silicon substrate. Preferably, the processing chamber is filled with any background gas containing oxygen, such as air, to provide luminescent microstructured silicon active elements in accord with the present invention. Other background gases that produce luminescent states in the silicon or other substrate may also be employed without departing from the inventive concepts.

As shown by block 500, the silicon substrate is then irradiated to produce microstructuring of the surface of the substrate. For fabricating infrared absorbing microstructured silicon active elements and for fabricating luminescent microstructured silicon active elements in accord with the present invention, any combination of laser intensity, pulse duration, number of pulses, wavelength, k-vector and polarization that produces surface microstructuring, or microscopic surface roughness, at each point of the silicon substrate, may be employed. For fabricating field emitting microstructured silicon active elements in accord with the present invention, it is presently preferred to employ that combination of laser intensity and pulse widths that produce comparatively sharp microstructured spikes on the silicon substrate. In general, it may be noted that the higher the intensity, the greater the height and sharpness of the spikes microstructured, and the shorter the pulse duration, the less is the height of the spikes microstructured. Reference may be had to an article by Her et al., entitled "Microstructuring of Silicon with Femtosecond Laser Pulses," appearing at Appl. Phys. Lett. 73, 1673-1675 (1998), incorporated herein by reference, for a description of silicon microstructured with 800 nm 100 fs laser pulses in $SF_6$ to give a patch of microstructured spikes fifty (50) micrometers high and from 0.8 to ten (10) microns wide. Reference may also be had to another article by Her et al. entitled "Femtosecond Laser-induced Formation of Spikes on Silicon," appearing at Appl. Phys. A 70, 383-385 (2000), incorporated herein by reference, for a description of the laser pulse duration, intensity and other laser parameters that control the morphology, including the comparative sharpness, of the features microstructured.

As shown by block 520, the silicon substrate is then translated relative to the laser beam to microstructure another surface point selected and the process is repeated until an area of interest has been microstructured. As shown by block 540, the substrate is then removed from the processing chamber.

Figure 17:
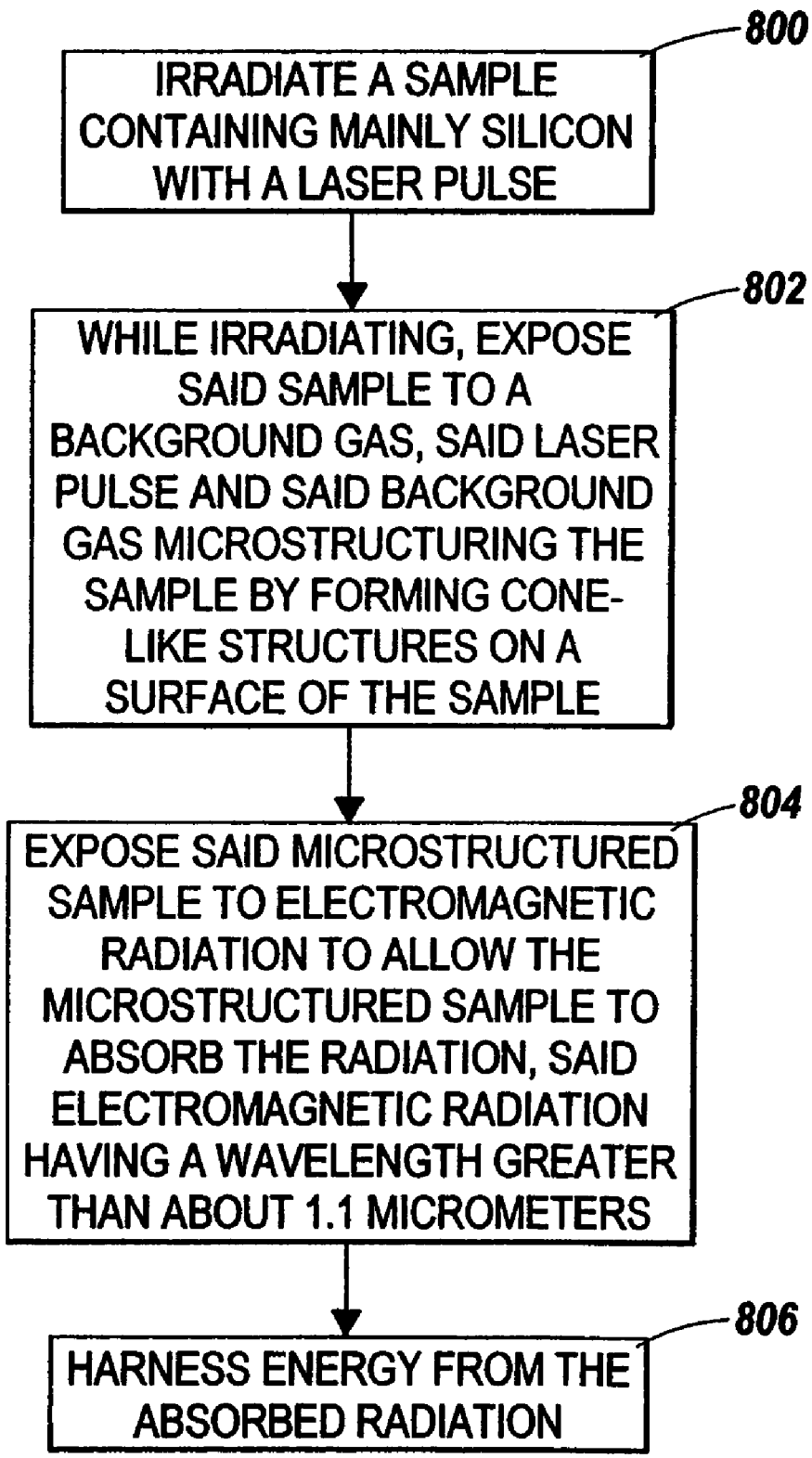
FIG. 17 shows a flowchart is for fabricating an absorber of electromagnetic radiation to harness energy according to the teachings of the present invention.

Referring to FIG. 17, a flow chart is shown for fabricating an absorber of electromagnetic radiation to harness energy. In step 800, a sample containing mainly silicon is irradiated with a laser pulse. In step 802, while irradiating, the sample is exposed to a background gas. The combination of the laser pulse and the background gas microstructure the sample by forming cone-like structures on a surface of the sample. In step 804, the microstructured sample is exposed to electromagnetic radiation to allow the microstructured sample to absorb the radiation, the electromagnetic radiation having a wavelength greater than about 1.1 micrometers. Subsequently, in step 806, energy is harnessed from the absorbed radiation.

Figure 18:
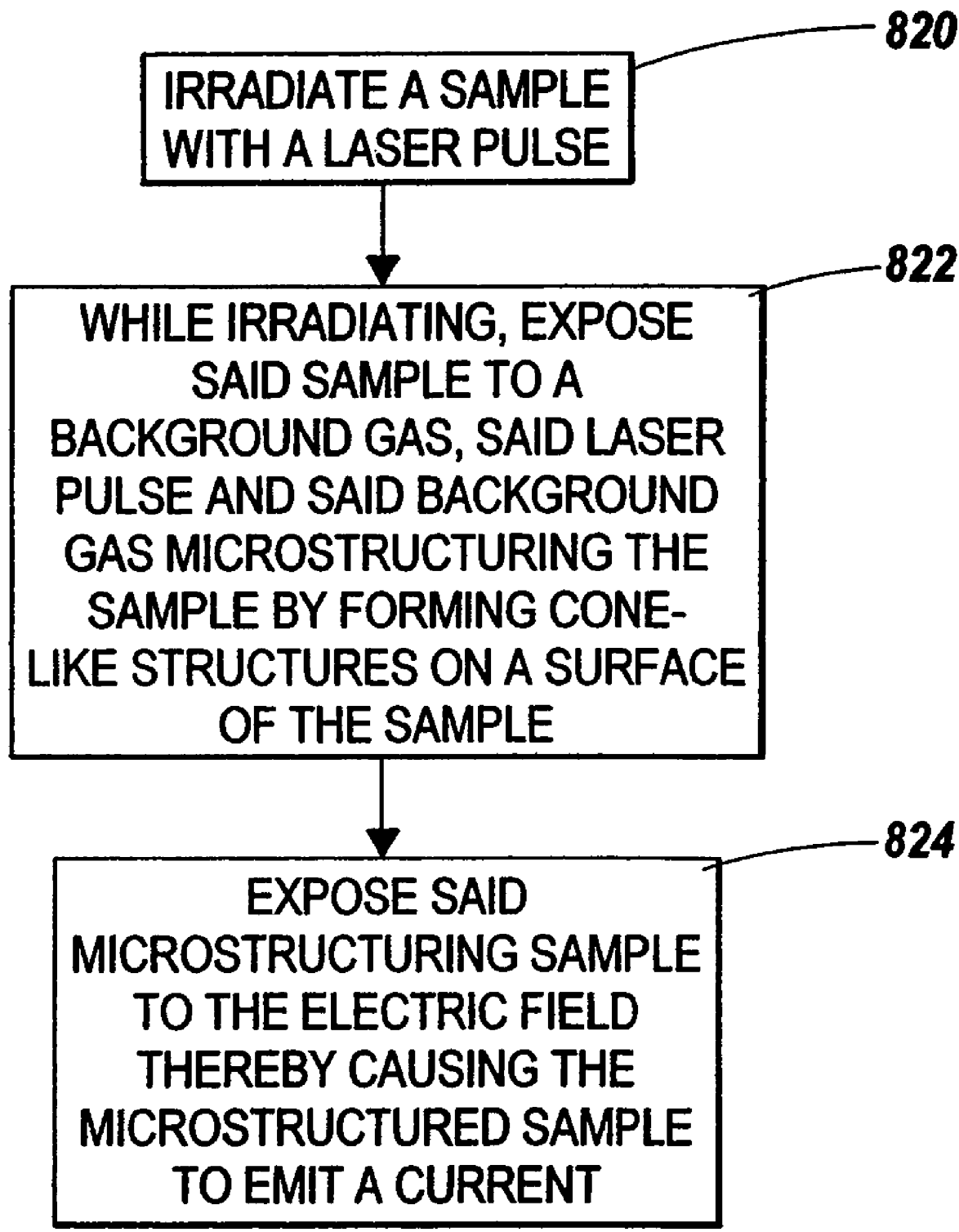
FIG. 18 shows a flowchart for fabricating a device for emitting an electric current according to the teachings of the present invention.

Referring to FIG. 18, a flow chart is shown for fabricating a device for emitting an electric current. In step 820, a sample is irradiated with a laser pulse. In step 822, while irradiating, the sample is exposed to a background gas. The combination of the laser pulse and the background gas microstructure the sample by forming cone-like structures on a surface of the sample. In step 824, the microstructured sample is exposed to an electric field thereby causing the microstructured sample to emit a current.

Figure 19:
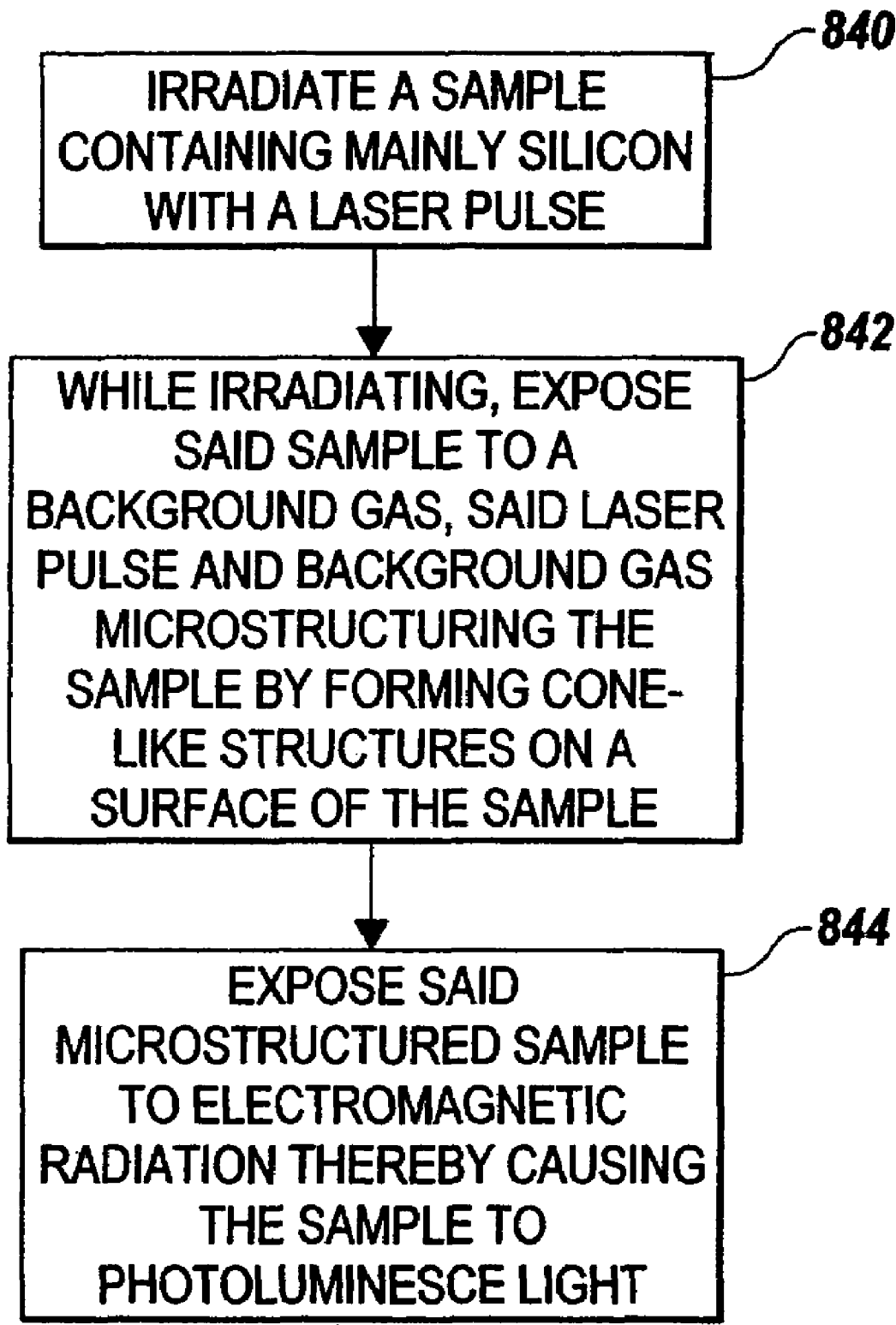
FIG. 19 shows a flowchart for fabricating a luminescent device according to the teachings of the present invention.

Referring to FIG. 19, a flow chart is shown for fabricating a luminescent device. In step 840, a sample containing mainly silicon is irradiated with a laser pulse. In step 842, while irradiating, the sample is exposed to a background gas, the laser pulse and background gas microstructuring the sample by forming cone-like structures on a surface of the sample. Subsequently, in step 844 the microstructured sample is exposed to electromagnetic radiation thereby causing the sample to photoluminesce.

Those skilled in the art will recognize, or be able to ascertain using no more than routine experimentation, many equivalents or additions to the specific embodiments and methods described herein. For example, the microstructured sample can be coupled to a controller, such as a microprocessor, to control the operation thereof. Also, although emphasis has been placed in the above description on using laser light to produce cone-like structures on a semiconductor surface, it should be understood that other methods, such as photolithographic techniques, can also be used to produce such structures. Equivalents are intended to be encompassed by the scope of the following claims.

What is claimed:

1. A method for detecting infrared radiation, the method comprising the steps of:
    providing a semiconductor having a plurality of microstructures formed thereon by laser light, the semiconductor possessing a band gap energy, $E_{bg}$;
    exposing said semiconductor to electromagnetic radiation to allow the sample to absorb a portion thereof, said electromagnetic radiation having a frequency smaller than $E_{bg}$ divided by Planck's constant;
    harnessing energy from the absorbed radiation in a photodetector by converting said absorbed radiation having said frequency smaller than $E_{bg}$ divided by Planck's constant into an electrical signal, said signal being indicative of an intensity of said absorbed radiation having a frequency smaller than $E_{bg}$ divided by Planck's constant; and utilizing said signal to indicate an intensity of the absorbed radiation having a frequency smaller than $E_{bg}$ divided by Planck's constant on a display.

2. The method of claim 1, wherein said step of providing a semiconductor having a plurality of microstructures comprises irradiating a semiconductor surface with a plurality of laser pulses while exposing the surface to a background gas.

3. The method of claim 2, wherein said background gas comprises at least one gas selected from the group consisting of a halogenic gas, nitrogen and air.

4. The method of claim 3, wherein said halogenic gas comprises $SF_6$.

5. The method of claim 1, wherein said semiconductor comprises silicon.

6. The method of claim 2, wherein said laser pulses have a pulse duration less than about 500 femtoseconds.

7. A method for detecting infrared radiation, the method comprising the steps of:
    providing a sample composed of primarily silicon having a plurality of microstructures formed thereon by laser light;
    exposing said sample to electromagnetic radiation to allow the sample to absorb a portion thereof, said electromagnetic radiation having one or more wavelengths greater than about 1.05 micrometers, and
    utilizing said sample in a photodetector to convert the radiation energy at said one or more wavelengths greater than about 1.05 micrometers to at least one electrical signal, said signal being indicative of an intensity of said absorbed radiation having one or more wavelengths greater than about 1.05 micrometers, and
    utilizing said signal to indicate an intensity of the absorbed radiation having one or more wavelengths greater than about 1.05 on a display.

8. The method of claim 7, wherein the step of providing includes providing a sample having a plurality of microstructures formed thereon by exposing said sample to laser light and to a background gas to help form the microstructures.

9. The method of claim 7, wherein the laser light includes a pulse of duration less than about 500 femtoseconds.

10. The method of claim 7, wherein the sample absorbs at least about 50% of the electromagnetic radiation to which the sample is exposed.

11. The method of claim 7, wherein the laser light is produced by a Ti:sapphire laser producing a wavelength of about 800 nanometers.

12. The method of claim 7, wherein the laser pulse provides a fluence of at least about 2 $kJ/m^2$.

13. The method of claim 7, wherein the laser light includes a plurality of laser pulses, each of duration less than about 150 femtoseconds, such that the time interval between each of the plurality of laser pulses is at least about $10^{-6}$ seconds.

14. The method of claim 13, wherein the plurality of laser pulses includes at least five laser pulses.

15. The method of claim 8, wherein the background gas is one of nitrogen, air, and a halogenic gas.

16. The method of claim 7, wherein the number density of the microstructures on the sample falls within a range of about $7.5 \times 10^{-3}$ to about $4 \times 10^{-2}$ per square micrometer.

17. The method of claim 16, wherein an average height of the microstructures is greater than about one micrometer.

18. The method of claim 15, wherein said halogenic gas comprises $SF_6$.

19. The method of claim 7, wherein the laser light includes a plurality of laser pulses with a duration of about 100 femtoseconds.

20. The method of claim 7, further comprising employing a microprocessor to indicate said signal intensity on the display.

21. A method for photodetection of infrared radiation, comprising irradiating a silicon substrate surface with a plurality of short laser pulses while exposing said surface to a background gas selected from the group consisting of a halogenic gas, nitrogen and air, exposing said laser-treated surface in a photodetector to radiation having one or more wavelengths greater than about 1.05 microns to convert the radiation at said one or more wavelengths greater than about 1.05 microns to one or more electrical signals, and utilizing said signals to indicate intensities of the absorbed radiation having one or more wavelengths greater than about 1.05 on a display.

\* \* \* \* \*